United States Patent
Clem et al.

(10) Patent No.: US 6,518,168 B1
(45) Date of Patent: Feb. 11, 2003

(54) SELF-ASSEMBLED MONOLAYER DIRECTED PATTERNING OF SURFACES

(75) Inventors: Paul G. Clem, Albuquerque, NM (US); Noo-Li Jeon, Cambridge, MA (US); Milan Mrksich, Chicago, IL (US); Ralph G. Nuzzo, Champaign, IL (US); David A. Payne, Champaign, IL (US); George M. Whitesides, Newton, MA (US); Younan Xia, Seattle, WA (US)

(73) Assignees: President and Fellows of Harvard College, Cambridge, MA (US); Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 09/029,317

(22) PCT Filed: Aug. 16, 1996

(86) PCT No.: PCT/US96/13223

§ 371 (c)(1),
(2), (4) Date: Nov. 2, 1998

(87) PCT Pub. No.: WO97/07429

PCT Pub. Date: Feb. 27, 1997

Related U.S. Application Data

(60) Provisional application No. 60/007,058, filed on Aug. 18, 1995.

(51) Int. Cl.[7] .......................................... H01L 21/4763

(52) U.S. Cl. ........................ 438/623; 438/624; 438/778

(58) Field of Search ................................. 427/226, 387, 427/409, 255, 256, 225, 555, 557, 558; 528/485; 525/475; 438/623, 624, 778, 781; 428/702; 423/610

(56) References Cited

U.S. PATENT DOCUMENTS

| 4,433,417 A | * | 2/1984 | Burnham et al. .............. 372/45 |
| 4,728,591 A | * | 3/1988 | Clark et al. .................. 428/333 |
| 4,793,676 A | * | 12/1988 | Risk .............................. 385/1 |
| 4,802,951 A | * | 2/1989 | Clark et al. .................. 156/630 |
| 4,908,299 A | * | 3/1990 | Ogawa ........................ 430/323 |

(List continued on next page.)

FOREIGN PATENT DOCUMENTS

WO    WO 96/29629    9/1996

OTHER PUBLICATIONS

E. Kim et al., "Combining Patterned Self–Assembled Monolayers of Alkanethiolates on Gold with Anisotropic Etching of Silicon to Generate Controlled Surface Morphologies," J. Electrochem. Soc., vol. 142, No. 2, pp. 628–633, Feb. 1995.

(List continued on next page.)

Primary Examiner—Olik Chaudhuri
Assistant Examiner—Laura M Schillinger
(74) Attorney, Agent, or Firm—Wolf, Greenfield & Sacks, P.C.

(57) ABSTRACT

A technique for creating patterns of material deposited on a surface involves forming a self-assembled monolayer in a pattern on the surface and depositing, via chemical vapor deposition or via sol-gel processing, a material on the surface in a pattern complementary to the self-assembled monolayer pattern. The material can be a metal, metal oxide, or the like. The surface can be contoured, including trenches or holes, the trenches or holes remaining free of self-assembled monolayer while the remainder of the surface is coated. When exposed to deposition conditions, metal or metal oxide is deposited in the trenches or holes, and remaining portions of the article surface remain free of deposition. The technique finds particular use in creation of conductive metal pathways selectively within holes passing from one side of a substrate to another.

32 Claims, 11 Drawing Sheets

U.S. PATENT DOCUMENTS

| | | | | |
|---|---|---|---|---|
| 4,948,629 A | * | 8/1990 | Hacker et al. | 427/53 |
| 4,964,972 A | * | 10/1990 | Sagiv et al. | 204/418 |
| 4,968,524 A | * | 11/1990 | Ogawa et al. | 427/36 |
| 5,077,085 A | * | 12/1991 | Schnur et al. | 427/98 |
| 5,079,600 A | * | 1/1992 | Schnur et al. | 357/4 |
| 5,093,154 A | * | 3/1992 | Hatada et al. | 427/43 |
| 5,198,269 A | * | 3/1993 | Swartz et al. | 427/126.2 |
| 5,234,850 A | * | 8/1993 | Liao | 257/338 |
| 5,243,202 A | * | 9/1993 | Mori et al. | 257/59 |
| 5,324,974 A | * | 6/1994 | Liao | 257/344 |
| 5,352,485 A | * | 10/1994 | DeGuire et al. | 427/226 |
| 5,455,072 A | * | 10/1995 | Bension et al. | 427/255 |
| 5,512,131 A | * | 4/1996 | Kumar et al. | 216/13 |
| 5,635,327 A | * | 6/1997 | Fukuda et al. | 430/128 |
| 5,641,709 A | * | 6/1997 | Lee | 438/3 |
| 5,669,303 A | * | 9/1997 | Maracas et al. | 101/327 |
| 5,674,783 A | * | 10/1997 | Jang et al. | 438/624 |
| 5,725,788 A | * | 3/1998 | Maracas et al. | 216/11 |
| 5,766,784 A | * | 6/1998 | Baskaran et al. | 423/610 |
| 5,776,748 A | * | 7/1998 | Singhvi et al. | 435/174 |
| 5,801,092 A | * | 9/1998 | Ayers et al. | 427/204 |
| 5,817,242 A | * | 10/1998 | Biebuyck et al. | 216/41 |
| 5,933,741 A | * | 8/1999 | Tseng | 438/305 |
| 5,939,150 A | * | 8/1999 | Stelzle et al. | 427/261 |
| 5,946,551 A | * | 8/1999 | Dimitrakopoulos et al. | 438/149 |
| 5,948,621 A | * | 9/1999 | Turner et al. | 427/150 |
| 5,951,881 A | * | 9/1999 | Rogers et al. | 216/41 |
| 5,959,735 A | * | 9/1999 | Maris et al. | 250/201.2 |
| 5,976,952 A | * | 11/1999 | Gardner et al. | 438/294 |
| 5,980,983 A | * | 11/1999 | Gordon | 106/1.25 |
| 5,981,383 A | * | 11/1999 | Lur et al. | 438/574 |
| 5,981,970 A | * | 11/1999 | Dimitrakopoulos et al. | 257/295 |
| 6,015,990 A | * | 1/2000 | Hieda et al. | 257/295 |
| 6,020,047 A | * | 2/2000 | Everhart | 428/209 |
| 6,027,595 A | * | 2/2000 | Suleski | 156/230 |
| 6,033,774 A | * | 3/2000 | Yitzchaik et al. | 252/582 |
| 6,048,632 A | * | 4/2000 | Solin et al. | 324/252 |
| 6,096,386 A | * | 8/2000 | Biebuyck et al. | 427/261 |
| 6,114,099 A | * | 9/2000 | Liu et al. | 430/324 |
| 6,180,239 B1 | * | 1/2001 | Whitesides et al. | 101/368 |
| 6,180,288 B1 | * | 1/2001 | Everhart et al. | 264/1.1 |
| 6,368,877 B1 | * | 4/2002 | Zhang et al. | 426/523 |
| 6,375,870 B1 | * | 4/2002 | Visovsky et al. | 216/24 |
| 6,380,101 B1 | * | 4/2002 | Breen et al. | 438/694 |
| 6,403,286 B1 | * | 6/2002 | Bellman et al. | 430/311 |
| 6,413,587 B1 | * | 7/2002 | Hawker et al. | 427/264 |

OTHER PUBLICATIONS

M. Kondo, "LiNbO$_3$ Waveguide Devices," Journal of the Ceramic Society of Japan, 101 (1), pp. 38–42. 1993.

X. Cao et al. "Efficient direct diode–laser frequency doubling in quasi–phase–matched LiNbO$_3$ waveguides," Optics Letters, vol. 17, No. 11, pp. 795–797, Jun. 1, 1992.

A.J. Moulson & J.M. Herbert, Electroceramics Materials●properties●applications, Chapman & Hall, Publishers, Capt. 8.3.5 "Thin–film optical switch", pp. 366–369, 1990.

B.A. Tuttle et al. Editors, Ferroelectric Thin Films IV, Materials Research Society Symposium Proceedings, vol. 361, pp. 155–166; 269–274; 281–286, Symposium held Nov. 29–Dec. 2, 1994.

A.E. Kaloyeros & M.A. Fury, "Chemical Vapor Deposition of Copper for Multilevel Metallization," MRS Bulletin, pp. 22–29, Jun. 1993.

P. Doppelt & T.H. Baum, "Chemical Vapor Deposition of Copper for IC Metallization: Precursor Chemistry and Molecular Structure," MRS Bulletin, pp. 41–48, Aug. 1994.

M. J. Hampden–Smith & T.T. Kodas, "Chemical Vapor Deposition of Metals: Part 1. An Overview of CVD Processes," Chem. Vap. Deposition, 1, No. 1, pp. 8–23, 1995.

S.J. Potochnik et al., "Selective Copper Chemical Vapor Deposition Using Pd–Activated Organosilane Films," Langmuir, vol. 11, No. 6, pp. 1841–1845, Jun. 1995.

N.L. Jeon et al. "Patterning of dielectric oxide thin layers by microcontact printing of self–assembled monolayers," J. Mater. Res., vol. 10, No. 12, pp. 2996–2999, Dec. 1995.

N.L. Jeon et al., "Patterned Self–Assembled Monolayers Formed by Microcontact Printing Direct Selective Metalization by Chemical Vapor Deposition on Planar and Nonplanar Substrates," Langmuir, vol. 11, No. 8, pp. 3024–3026, 1995.

T.P. Moffat and H. Yang, "Patterned Metal Electrodeposition Using an Alkanethiolate Mask," J. Electrochem. Soc., vol. 142, No. 11, pp. 220–222, Nov. 1995.

Abstract J.K. Schoer et al., "Scanning Probe Lithography. 2. Selective Chemical Vapor Deposition of Copper into Scanning Tunneling Microscope–Defined Patterns," Langmuir, 10(3), 615–18 (1994).

E.A. Dobisz et al., "Self–Assembled Monolayer Films for Nanofabrication," Mat. Res. Soc. Symp. Proc., vol. 380, pp. 23–33, 1995.

* cited by examiner

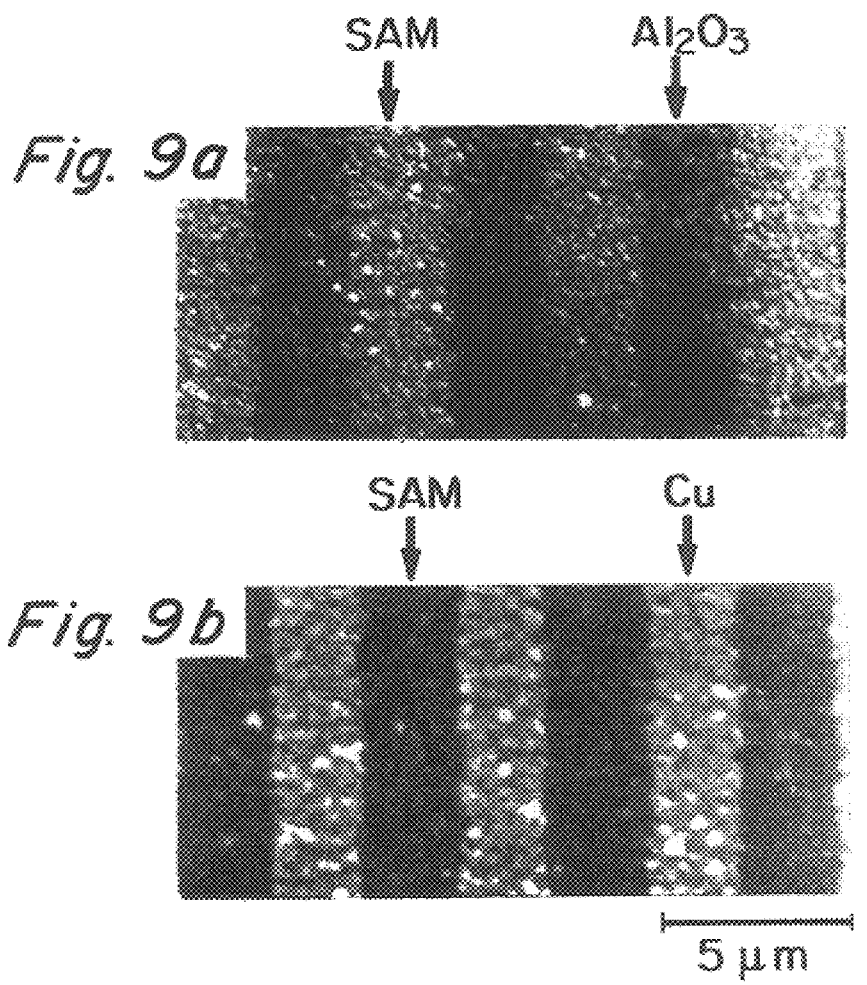
Fig. 9a
Fig. 9b
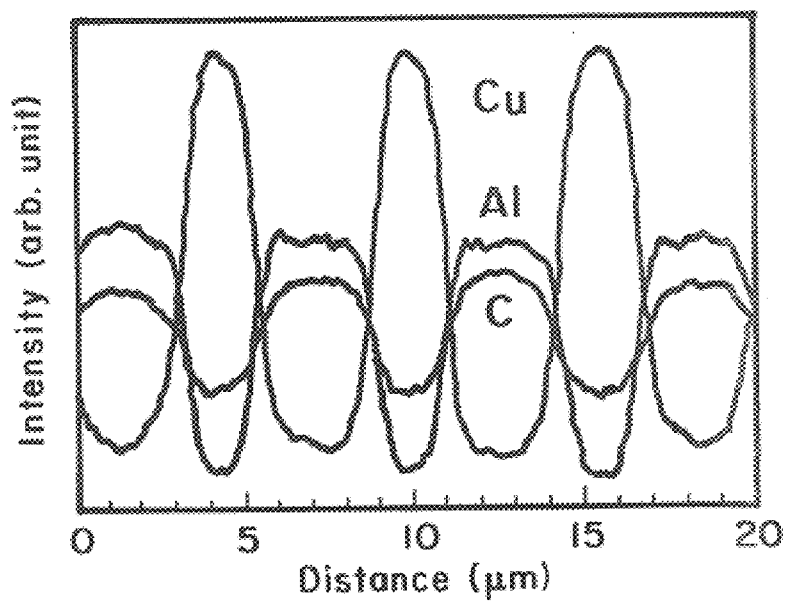
Fig. 9c

SELF-ASSEMBLED MONOLAYER DIRECTED PATTERNING OF SURFACES

RELATED APPLICATION

This application claims priority to U.S. Provisional Patent Application Ser. No. 60/007,058, filed Aug. 18, 1995 by Clem, et al., and entitled "Patterned Materials Deposition Effected With Microcontact Printing", incorporated herein by reference.

FIELD OF THE INVENTION

The present invention relates generally to the derivatization of surfaces with self-assembled monolayers using microcontact printing, and more particularly to selective derivatization of raised portions of substrates, selective derivatization of indentations in substrates, and chemical vapor deposition and sol-gel deposition on substrates in patterns dictated by patterns of self-assembled monolayers.

BACKGROUND OF THE INVENTION

In the fields of microfabrication for microelectronic devices, microoptical devices, and microbiological devices, precision, reproducibility, and small feature size is important. The development of devices that are small relative to the state of the art and conveniently and relatively inexpensively reproduced is a goal. A well-known method of production of such devices is photolithography. In this technique a negative or positive resist (photoresist) is coated onto an exposed surface of a material. The resist then is irradiated in a predetermined pattern, and irradiated (positive resist) or nonirradiated (negative resist) portions of the resist are removed from the surface to produce a predetermined resist pattern on the surface. This can be followed by one or more procedures such as etching, plating, and the like. X-ray and electron-beam lithography have found similar use.

While irradiative lithographic methods may be advantageous in many circumstances, all require relatively sophisticated and expensive apparatus to reproduce a particular pattern, and are relatively time-consuming. Additionally, these techniques are not easily employed with nonplanar surfaces. In the field of electronic circuitry, an attempt is often made to save space by stacking planar circuit boards or chips, the boards or chips interconnected with auxiliary contacts. Alternately, a board or chip may be bent or otherwise formed in a nonplanar manner so as to save space, auxiliary contacts connecting components on different sides of the bend. All too often these auxiliary contacts are the cause of circuitry failure, and the attempt to move from the two-dimensional domain to a three-dimensional domain fails. Irradiative lithography provides no remedy to this complication, nor does it provide a method of conveniently and inexpensively reproducing an existing microelectronic circuit pattern, or the surface morphological features of other objects of interest.

U.S. Pat. No. 5,512,131 (Kumar and Whitesides) entitled "Formation of Microstamped Patterns on Surfaces and Derivative Articles", issued Oct. 4, 1993, describes a technique for patterning a material surface with an elastomeric stamp. The stamping surface of the stamp is coated with a self-assembled monolayer-forming species having a functional group selected to bind to a particular material. The stamping surface is placed against a surface of the material and, when removed, a self-assembled monolayer of the species is created on the surface according to the stamping surface pattern. Etching and plating can follow.

Microfabrication of patterned materials such as metals and oxides is a very important area of current research and development. Integration of oxide thin films with semiconductor substrates is a critical technology for a variety of microelectronic memory and circuit applications. Current technology of patterning oxides typically involves uniform deposition followed by post-deposition etching. This processing can present difficulties with respect to nonuniform etch rates and ill-defined typography and large index gradients. In particular, $LiNbO_3$ is especially inert and etch-resistant and these obstacles have led to the use of in-diffusion and ion-exchange techniques to fabricate waveguides.

Copper, prized for its high conductivity and resistance to electromigration, is difficult to pattern as fine lines using conventional techniques such as reactive ion etching. Low throughout of ion-milling processes further complicates the design of a practical commercial process. Chemical vapor deposition is widely used for deposition of metals and ceramics on surfaces, but a simple, convenient technique for patterning a surface using chemical vapor deposition is lacking.

Accordingly, it is an object of the present invention to provide a convenient technique for creating patterned features of metals, oxides, and other materials on surfaces in a manner that minimizes process steps, reduces fabrication costs, and eases environmental concerns by reducing the quantity of chemical process waste. It is another object to provide a technique for selective deposition of such materials in indentations of articles having contoured surfaces.

SUMMARY OF THE INVENTION

The present invention provides techniques for depositing material, in a pattern, on a substrate surface while leaving regions contiguous with the patterned region free of the material or removing material from regions to leave the material in the pattern. A blocking agent is applied to the surface in a pattern and material is deposited in a pattern complementary to the blocking agent pattern, or material is deposited at all regions but removed from the blocking agent pattern. According to one aspect, the method involves effecting chemical vapor deposition on a substrate in a predetermined pattern. The method involves forming on a substrate a blocking agent such as a polymeric agent or a self-assembled monolayer (SAM) of a molecular species in a pattern which acts to block chemical vapor deposition (CVD) where the self-assembled monolayer is formed, and exposing the surface to chemical vapor deposition conditions. Chemical vapor deposition is thereby allowed to occur selectively at regions not covered by the blocking agent. Thus, the method involves allowing a SAM to dictate a pattern in which CVD occurs at a surface. In one embodiment, the method involves transferring a SAM-forming molecular species from an applicator to the surface in a pattern so as to transfer a SAM to a first portion of the surface, while leaving a second portion contiguous with the first portion free of SAM, effecting chemical vapor deposition at the portion of the substrate not covered by the SAM, and removing the SAM. In this and/or other techniques of the invention, the applicator can be a stamp having a conformable surface that is used to transfer the SAM-forming species to the substrate surface. The stamp can have a patterned surface with protrusions and indentations, the outward-facing surfaces of the protrusions defining a stamping surface, or can be essentially flat. The applicator can be an elastomeric polymer.

The present invention provides, according to another aspect, a method involving depositing a pattern of a material such as a metal or metal oxide on a substrate. According to one embodiment, the method involves forming a blocking agent such in a pattern on a substrate and exposing the substrate to a sol-gel precursor of the material and allowing the material to form on the substrate in a pattern dictated by the pattern of the blocking agent. The technique can involve applying a SAM-forming molecular species to a surface of an applicator such as a stamping surface of stamp, contacting a first portion of a substrate with the applicator surface to transfer a SAM to the first portion while leaving a second portion of the substrate contiguous with the first portion free of SAM, applying a sol-gel precursor to the substrate and depositing the material at the second region of the substrate, and removing the oxide from the first portion of the substrate leaving the deposited material at the second portion. In one embodiment, the sol-gel precursor is a precursor of a metal oxide, including a metal or metals selected from the group consisting of Bi, Zr, Sr, Sc, Ta, Li, Nb, Pb, Ti, Ba, and combination thereof. For example, the sol-gel precursor can be a precursor of lead zirconium titanate, barium strontium titanate, lead scandium tantalate, lithium niobate, lead lanthanum titanate, lead zirconium titanate, barium strontium titanate, barium titanate, tantalum oxide, or a combination of any of the above.

The invention provides, according to another aspect, a method that involves providing an article having a surface including a plurality of protrusions having outward-facing surfaces contiguous with regions that intervene the outward-facing surfaces, and forming on at least one outward-facing surface a SAM-forming molecular species while leaving regions that intervene the outward-facing surfaces essentially free of the molecular species.

The invention provides, according another aspect, a method that involves providing an article having a surface including at least one indentation and a region contiguous with the indentation, and forming on the surface at the region contiguous with the indentation a SAM-forming molecular species while leaving the surface at the indentation essentially free of the molecular species.

In each of the methods described herein, one or any number of protrusions, or one or any number of indentations can be included in the surface. In addition, planar or nonplanar surfaces can be derivatized. Techniques of the invention can further include applying, via chemical vapor deposition or solution deposition such as sol-gel deposition, material to regions of the surface of the substrate dictated by the SAM pattern. The present invention also provides articles formed in accordance with methods described herein.

The invention also provides a method involving providing an article having a contoured surface including at least one indentation and a region contiguous with the indentation, and forming a self-assembled monolayer at the region contiguous with the indentation while leaving the indentation essentially free of the self-assembled monolayer.

Also provided is a method involving applying to at least one portion of a surface of an article a CVD blocking agent from an applicator, and exposing the surface to chemical vapor deposition conditions.

The invention also involves exposing a nonplanar surface to chemical vapor deposition conditions and allowing material to be deposited on a first portion of the surface while blocking a second, contiguous portion of the surface from deposition.

Also provided is a method involving exposing a surface, on at least a first portion of which is a blocking agent, to a sol-gel precursor of a material to be deposited at the surface.

The invention also provides a method involving depositing, from a sol-gel precursor solution, a metal oxide on a first portion of a surface of a substrate while allowing second portions of the substrate surface contiguous with the first portion to remain free of the metal oxide, the first portion of the substrate surface having a lateral dimension of less than about 5 $\mu$m.

A method of exposing a substrate surface to CVD conditions is provided as well, and involves depositing material on a first portion of the substrate surface selectively at a rate of at least about 300 Angstroms per minute growth of material while preventing material from being deposited at a second portion of the substrate surface contiguous with the first portion.

The invention also provides a method involving depositing, via CVD or sol-gel processing, material proximate first and second portions of a substrate surface, and removing the material from the first portion while allowing the material to remain at the second portion.

Other advantages, novel features and objects of the invention will become apparent from the following detailed description of the invention when considered in conjunction with the accompanied drawings which are schematic and which are not intended to be drawn to scale. In the Figures, each identical or nearly identical component that is illustrated in various Figures is represented by a single numeral. For purposes of clarity, not every component is labeled in every Figure.

BRIEF DESCRIPTION OF THE DRAWINGS

FIGS. 5a and 5b illustrate (a) a photocopy of an optical micrograph of patterned $LiNbO_3$ on a silicon surface in accordance with the invention, and (b) Auger electron spectroscopy (AES) line scans across the lines of FIG. 5a;

FIGS. 9a–9c are photocopies of (a) a SEM of a patterned SAM on an alumina surface, (b) lines of copper deposited by selective CVD on the surface illustrated in FIG. 9a, the copper pattern complementary to the SAM pattern, and © corresponding AES line scan on the sample of FIG. 9b in the direction perpendicular to the lines of copper;

Figure 10A:
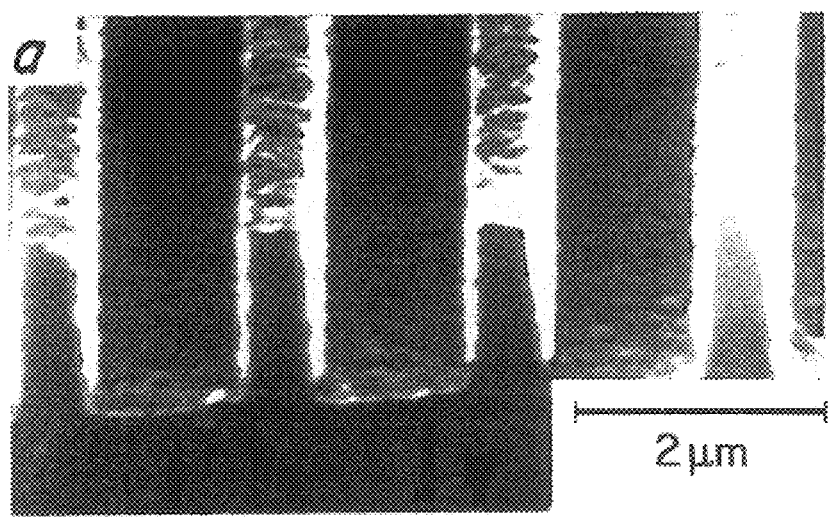
Figure 10B:
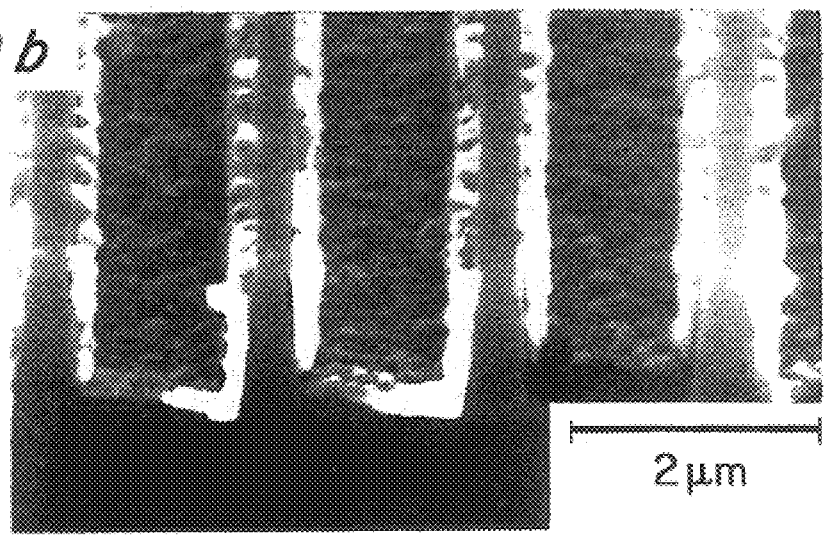
Figure 10C:
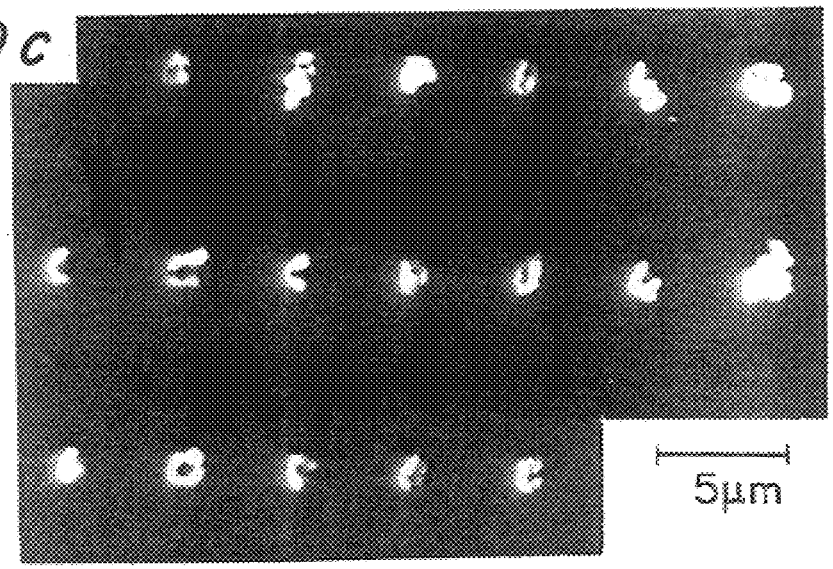
Figure 11:
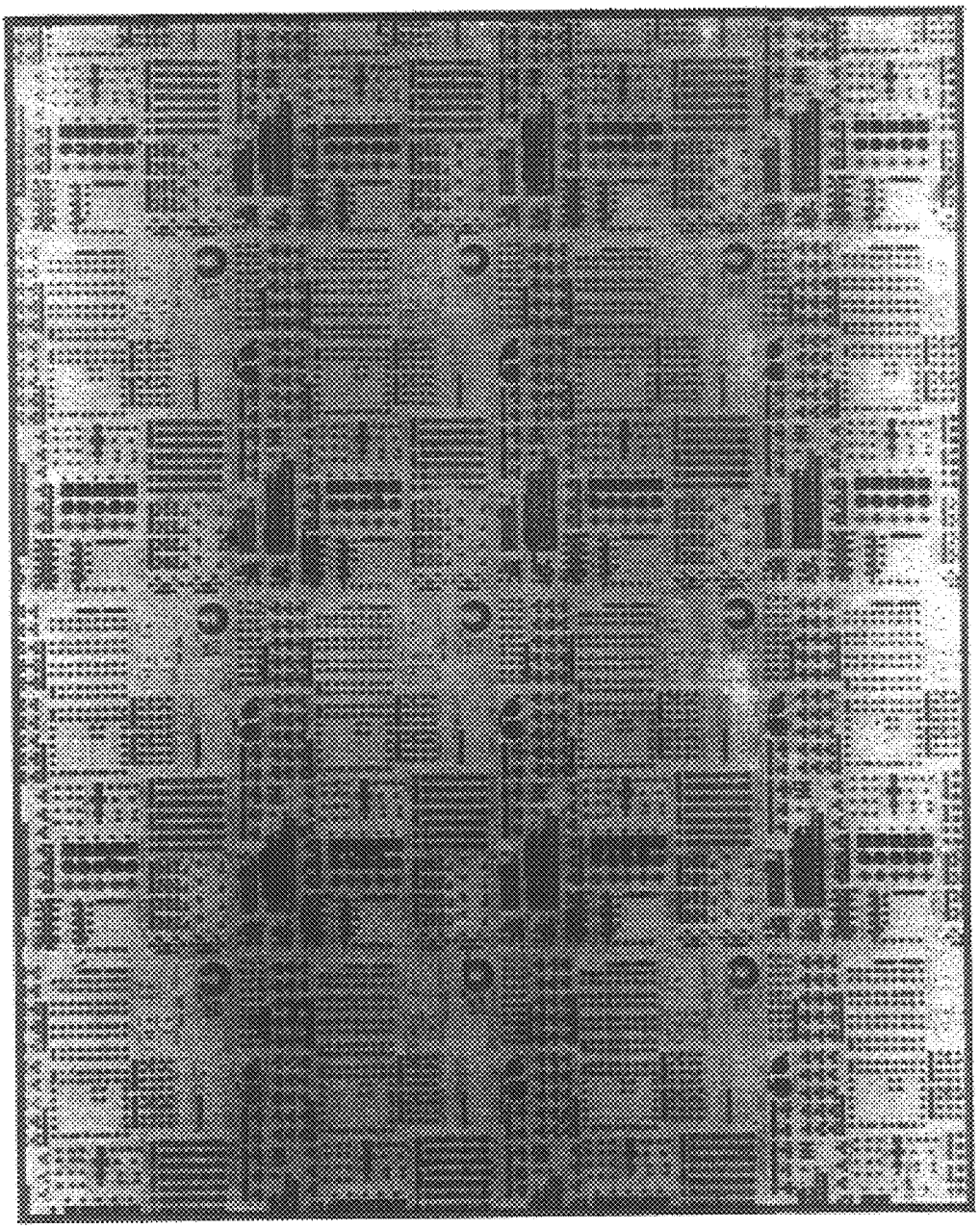
Figure 12A:
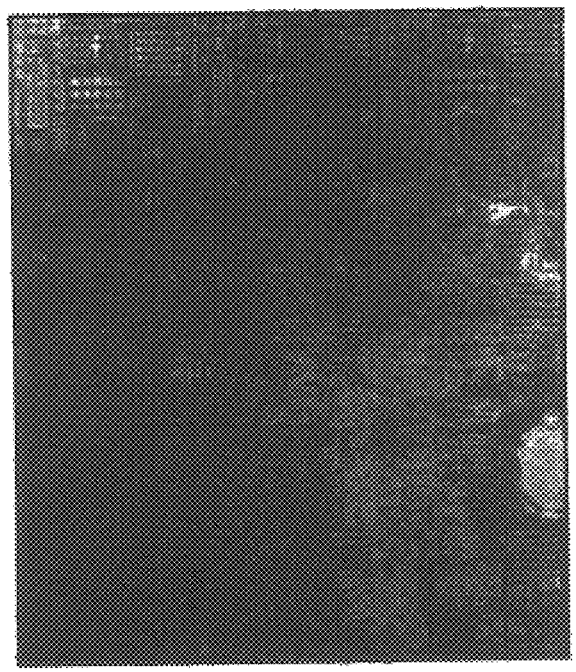
Figure 12B:
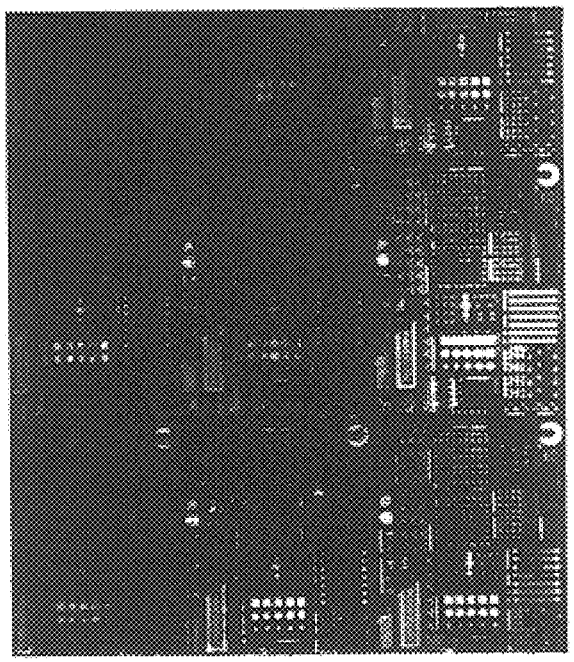
Figure 13:
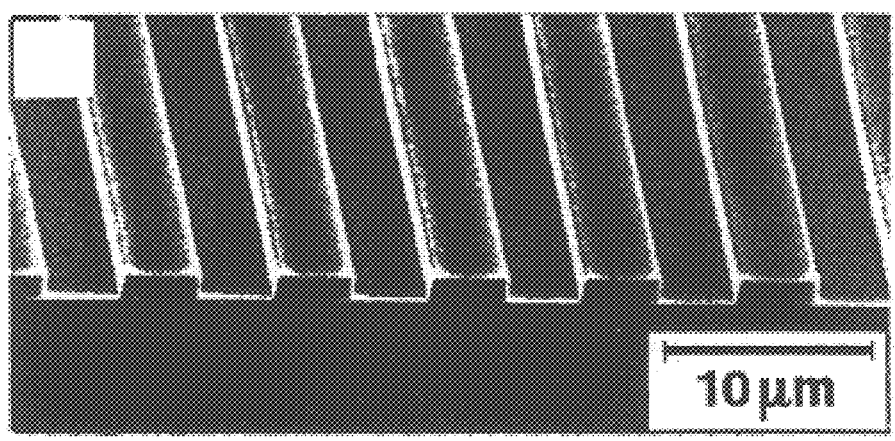

FIGS. 10a–10c are photocopies of SEMs of copper applied by CVD to substrates whose surfaces were (a) underivatized, and (b, c) derivatized by a monolayer of SAM at the outward-facing surfaces of protrusions (b) or on an essentially planar surface at regions with the exception of indentations (c);

FIG. 11 is a photocopy of a micrograph of a pattern of copper deposited via low-throughput CVD on a substrate patterned with a SAM, in a pattern complementary to the SAM pattern;

FIGS. 12a and 12b are photocopies of (a) a micrograph of a pattern of copper deposited via high-throughput CVD on a substrate patterned with a SAM, and (b) a micrograph of the surface of FIG. 12a after mild abrasion to remove copper from SAM-protected regions; and FIG. 13 is a photocopy of an SEM image of a polyurethane blocking agent formed on a substrate.

DETAILED DESCRIPTION OF THE INVENTION

The following documents are incorporated herein by references for all purposes:

U.S. Pat. No. 5,512,131, filed Oct. 4, 1993, issued Apr. 30, 1996, by Kumar et al.;

Commonly-owned, co-pending U.S. patent application Ser. No. 08/397,635, filed Mar. 1, 1995 by Whitesides et al., and its CIP, U.S. patent application Ser. No. 08/676,951, filed Jul. 8, 1996;

"Chemical Vapor Deposition of Copper for Multi Level Metalization" by A. E. Kaloyeros and M. A. Fury, MRS Bulletin, June, 1993 pages 22–29;

"LiNbO$_3$ Waveguide Devices" by M. Kondo, Journal of the Ceramics Society of Japan, 101, 38–42 (1993);

"Efficient Direct Diode-Laser Frequency Doubling and Quasi-Phase-Matched LiNbO$_3$ Waveguides" by X. Chao et al., Optics Letter, 17:11, Jun. 1, 1992;

"Ferroelectric Thin Films IV", B. A. Tuttle, et al., Materials Research Society Symposium Proceeding Volume 361 pager 155–167, 269–287;

"The Chemistry of Metal CVD", T. P. Kodas, M. J. Hampden-Smith, VCH (New York) 1994.

The present invention involves the use of a blocking agent formed in a pattern on a substrate surface for directing materials deposition in the micron and submicron range. Lithography-free methods can be carried out using this technology for depositing patterned metals via CVD, metal oxides, and the like without the need for extensive subsequent processing. The need for high vacuum, complicated and expensive electronics, high temperatures for processing, and a cleanroom environment thereby is avoided. Significant expense is saved.

For purposes of illustration, much of the description of the invention below in conjunction with the drawings describes a process in which a SAM is the blocking agent. However, as discussed further below, a variety of blocking agents can be used, and the invention lies in using a blocking agent at a surface to direct deposition of material and/or to facilitate removal of deposited material from selected areas of the surface. A blocking agent such as a SAM is applied to surfaces serve to control nucleation and adhesion of overlayers of material from a precursor source, such as a CVD environment or a fluid precursor such as a sol-gel. Material from such precursor sources adheres loosely and poorly to the blocking agent, or is formed thereon with poor structural characteristics, and can be removed from the blocking agent easily by thermal and/or mechanical agitation. In this manner, the blocking agents direct material growth in a predetermined pattern. Materials such as copper, LiNbO$_3$, lead-lanthanum-titanate (PLT) and the like can be used as components of integrated optical and DRAM devices, large substrate devices such as flat panel displays, and the like. The methods eliminate many levels of processing, reduce waste, allow new applications for which conventional projection lithography is inappropriate, and can be used on nonplanar (such as a fiber, etc.) or planar substrates. Many commercial devices can be processed, such as waveguides.

Figure 1A:
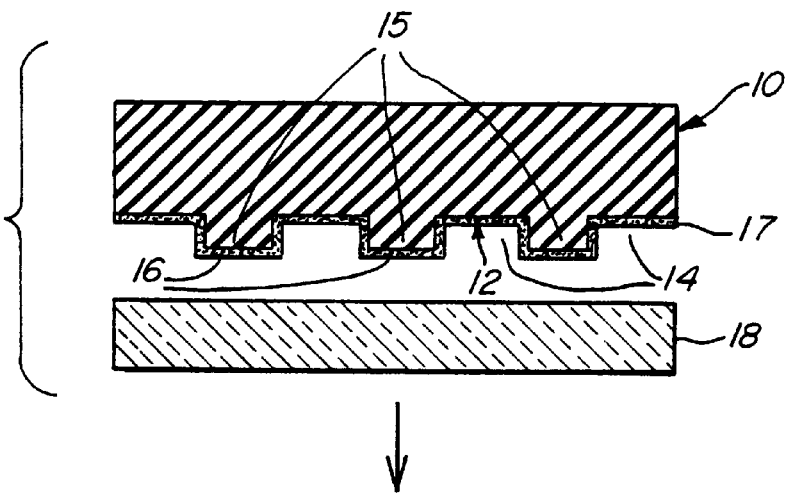
FIGS. 1a–1d illustrate schematically microcontact printing of a SAM on a surface followed by sol-gel deposition and removal of the oxide.
Figure 1B:
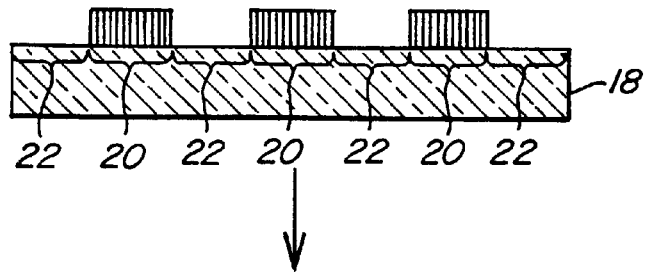
Figure 1C:
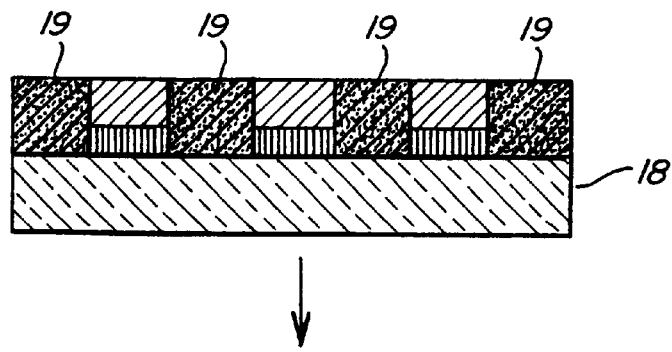
Figure 1D:
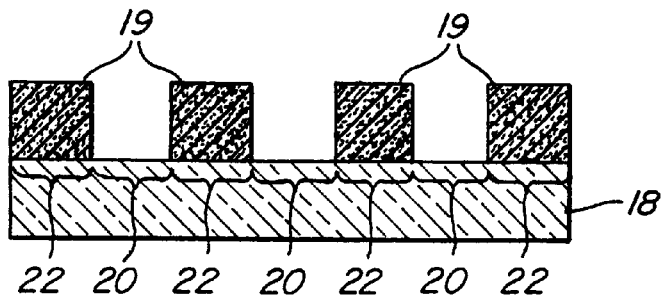

FIGS. 1a–d illustrate schematically formation of a pattern of material on a substrate in accordance with the invention. In FIG. 1a an applicator 10 includes a surface 12 including indentations 14 and protrusions 15. The protrusions have outward-facing surfaces 16. Surface 12, at least outward-facing portions 16 thereof, is coated with a SAM-forming species 17. When the applicator is applied to substrate 18 and removed, a SAM is formed at regions 20 of the substrate contacted by outward-facing surfaces 16 (defining a stamping surface) of the protrusions, as illustrated in FIG. 1b. Intervening regions 22 of the substrate, which are not contacted by the stamping surface, are free of SAM. A sol-gel precursor then is applied to the surface of the substrate by, for example, dip coating or spin-casting. After heat treatment amorphous oxide 19 forms at regions 22 and adheres well to the substrate, but above regions 20 oxide is poorly adhered and easily removed by thermal and/or mechanical agitation, resulting in the substrate 18 including oxide 19 patterned at portions 22 of the substrate surface, that is, deposited on the substrate surface in a pattern complementary to the SAM pattern (FIG. 1d). The resulting article then can be exposed to conditions under which the oxide is crystallized.

The resulting article includes well-defined features and can serve as waveguide, decoupling capacitor, thin-film optical switch, optical modulator, optical matrix switch or the like. Waveguides having high index gradients and other devices can be fabricated in this manner to include well-defined features of a wide range of lateral dimensions. For example, waveguides result having index gradients of greater than 0.1, greater than 0.25, greater than 0.5, or greater than 1 at 850 nanometers can be produced. A frequency doubling waveguide resulting in blue light for optical communication can be produced according to the method.

Essentially any material that can be deposited via sol-gel techniques can be amenable for processing according to the method of the invention. Ferroelectric and electrooptic materials and sol-gel processing of a variety of precursors to form a variety of species is well known to those of ordinary skilled in the art and can be applied and exploited by the method of the invention. For example, materials such as PbScTaO$_3$, (Pb, La)TiO$_3$ (PLT), LiNbO$_3$, KNbO$_3$, LiTaO$_3$, potassium diphosphate, potassium triphosphate, PbMoO$_4$, TeO$_2$, Ta$_2$O$_5$ BaTiO$_3$, BBO crystals, Ba$_{1-x}$Sr$_x$TiO$_3$, Pb(Zr, Ti)O$_3$, SrTiO$_3$, bismuth strontium tantalate, and the like.

Figure 2A:
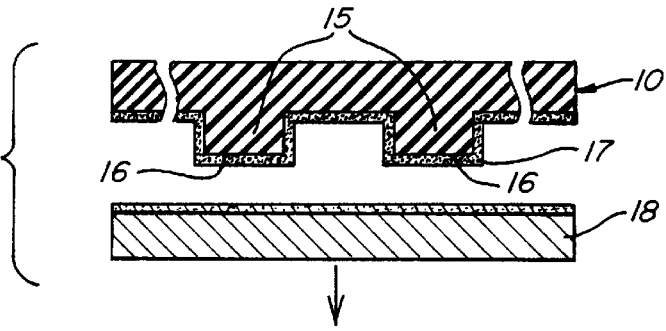
FIGS. 2a–2c illustrate patterning a SAM on a planar surface using microcontact printing followed by CVD of metal.
Figure 2B:
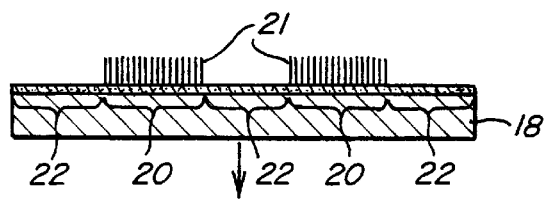
Figure 2C:
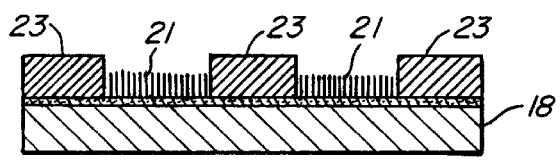

FIGS. 2a–2c illustrate schematically one embodiment of the invention in which a SAM dictates a pattern in which material is applied to a surface via CVD. In FIG. 2a an applicator 10, including protrusions 15 having outward-facing surfaces 16, is used to transfer a SAM-forming species 17 from outward-facing surfaces 16 and thereby to apply a SAM 21 in a pattern to portions 20 of substrate 18, leaving complementary portions 22 of the substrate free of the SAM. Then, the surface is exposed to CVD conditions, whereby material 23 is deposited selectively at portions 22. Gentle thermal, mechanical, or chemical agitation of the surface can be used to remove the SAM, with or without any overlying material deposited via CVD onto the SAM. The result is material 23, deposited in a pattern complementary to the SAM pattern. Those of ordinary skill in the art will recognize that the term "CVD conditions", as used herein, involves subjecting a surface of a substrate to those conditions of temperature, pressure (including vacuum), and chemical vapor at which CVD occurs at the substrate surface.

CVD precursors suitable for use in accordance with the invention included inorganic precursors, metal-organic precursors, organometallic precursors, and any others capable of leading to CVD. Precursors of metals such as silver, aluminum, gold, cobalt, chromium, copper, manganese, nickel, lead, palladium, platinum, titanium, zirconium, and the like, or of multi-metallic compounds of interest, can be used to produce a variety of CVD products. These species, and others, can be provided with a variety of organic or inorganic ligands or in inorganic form without ligands. Such are well known in the art. Any CVD apparatus, such as hot and cold-wall reactors, can be used.

A particular SAM to be used with a particular CVD precursor can be selected, or screened, as follows. A variety of SAMs can be formed on a substrate, the substrate can be exposed to conditions of temperature and/or pressure (and/or vacuum) commensurate with a desired CVD process, and the durability of the SAMs evaluated. SAMs durable under a desired CVD condition will be suitable for use in methods of the invention involving CVD. The combination should also be evaluated to assure that gentle thermal, chemical, or mechanical agitation will remove the SAM along with the material deposited via CVD thereupon. CVD materials and processes suitable for use in accordance with the invention are described in "Chemical Vapor Deposition of Metals: Part 1. An Overview of CVD Processes" by M. J. Hampden-Smith and T. T. Kodas, Chemical Vapor Deposition 1995, No. 1, pages 8–22. A similar screening test can be used to evaluate combinations of particular SAMs and sol-gel precursors.

Figure 3A:
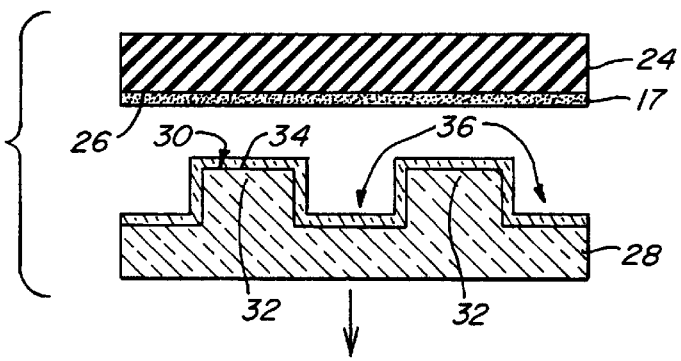
FIGS. 3a–3c illustrate patterning a SAM on a nonplanar surface followed by CVD of metal on regions of the surface not protected by the SAM.
Figure 3B:
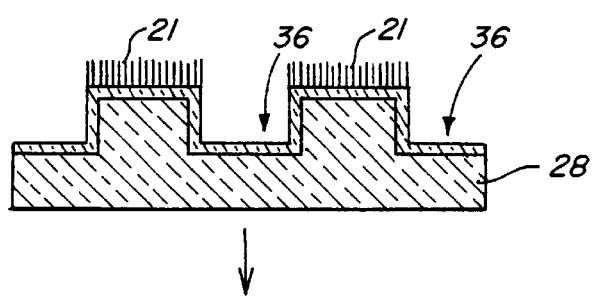
Figure 3C:
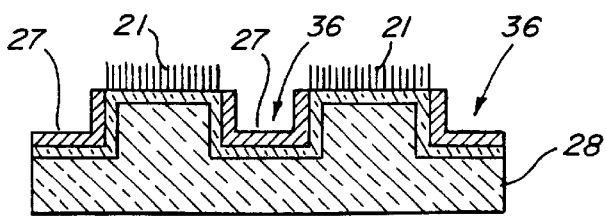

FIGS. 3a–3c illustrate an aspect of the invention that involves applying to outward-facing surfaces of protrusions of an article, selectively, a SAM. In FIG. 3a, an applicator 24 having a substantially planar stamping surface 26 carries a SAM-forming molecular species 17 at surface 26. Article 28 includes a surface 30 including protrusions 32 having outward-facing surfaces 34 contiguous with regions 36 that intervene the outward-facing surfaces 34. Described alternatively, article 28 includes a surface 30 having indentations 36 contiguous with remaining portions 34.

When stamping surface 26 is brought into contact with outward-facing surfaces 34, a SAM 21 is transferred, selectively, to outward-facing surfaces 34. (FIG. 3b). Then, if article 28 is exposed to CVD conditions, a CVD product 27 is deposited selectively at intervening regions 36. The SAM can then be removed, resulting in a pattern of material deposited via CVD at intervening regions 36 not protected by the SAM. As in the above-discussed arrangement, CVD may result also in deposition atop SAM 21, but the material deposited thereon will be weakly adhered and easily removed via agitation.

The sol-gel process described above with reference to FIGS. 1a–1d can be carried out on a contoured surface as illustrated in FIGS. 3a–3c. In such an arrangement, material will be deposited at indentations 36 selectively (with or without some weakly adhered material deposition at SAMs 21). Following removal of SAMs 21 with or without overlying material, material will remain at indentation 36. Where indentations 36 define channels in electronic circuitry, such as passageways from one side of a circuit board to another, an advantageous electrical connection pathway results. Although not illustrated in FIG. 1, 2, or 3, this embodiment can be envisioned with reference to FIG. 3c. Where article 28 is a flat article, holes passing from one side of the article to another can be envisioned as indentation 36 passing completely through the article. Application of a SAM to one or both sides of the article, followed by exposure to CVD conditions, will result in deposition within the holes while one or both outer surfaces remain free of deposition or can be cleaned easily of deposition atop SAMs.

In another embodiment of the invention a combination of patterned SAMs and CVD, at various throughput rates of CVD, results in selective CVD only at regions not protected by the blocking agent (e.g.SAM), or CVD essentially at all locations. At higher throughput rates, CVD can be made to occur on the substrate both at unprotected locations, and at some or all locations protected by the blocking agent, and a subsequent lift-off procedure removed material deposited at locations other than the originally-unprotected regions. Lift-off can be accomplished in most instances by mild, abrasive-free mechanical polishing to remove material deposited atop SAMs with or without the SAMs. Lift-off also can involve applying Scotch™ tape to the surface and peeling off the material atop the SAMs, mild polishing on a cotton felt wetted with isopropanol, or the like. The technique has been used to successfully deposit metal in a pattern including features (portions with lateral dimensions) with sizes ranging from about 5 to about 250 μm, on a variety of technologically important substrates including ITO, titanium nitride, thermal and plasma-grown $SiO_2$, $Al_2O_3$ and glass.

Although not specifically illustrated, this embodiment can be envisioned easily with reference to FIGS. 2 and 3. FIGS. 2 and 3 are illustrative of embodiments of the invention in which CVD occurs selectively only at those regions not protected by SAM blocking agents or masks. At higher throughput rates, CVD occurs not only at regions 22 of the substrate (FIG. 2c) or at indentations 36 (FIG. 3c), but occurs as well on SAMs 21. Following mild agitation, material deposited atop the SAMs is removed, but material deposited elsewhere remains. Thus, highly-selective CVD can be carried out at very high throughput rates. In particular, throughput rates involving growth of material such as copper at a rate greater than about 300 Angstroms per minute, at a higher rate about 500 Angstroms per minute, and in a still higher rate greater than about 800 Angstroms per minute, can be achieved. At lower throughput rates, selective deposition can occur (no deposition at SAMs). for example at approximately 100 Angstroms per minute or approximately 200 Angstroms per minute.

Thus, the invention involves a technique for area-selective CVD at a surface that is throughput-rate dependent, and a technique for CVD at a surface followed by mechanical lift-off at selective regions that had been pre-treated with a blocking agent.

Figure 4:
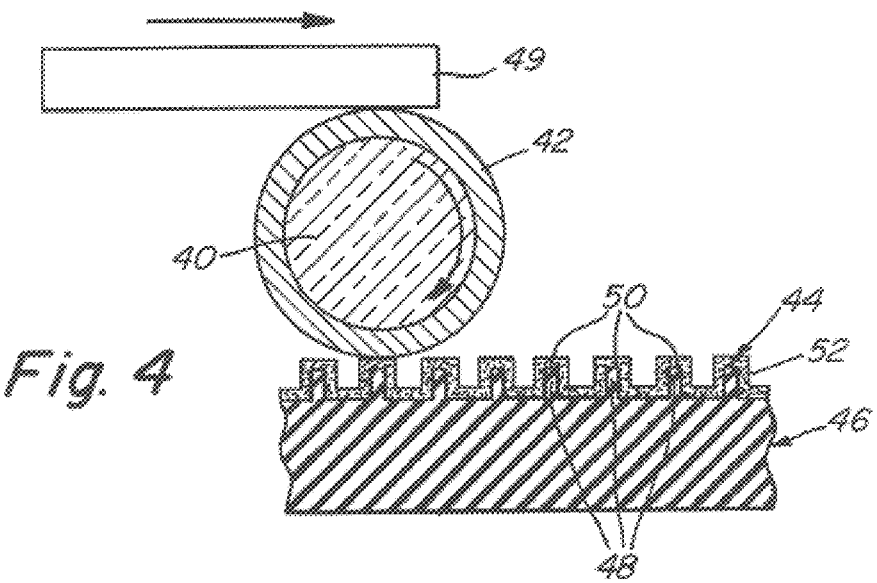
FIG. 4 illustrates application of a SAM to a nonplanar surface that can be further modified via CVD or solution deposition.

FIG. 4 illustrates an embodiment of the invention that involves rolling a curved substrate 40 having a surface 42 over a surface 44 of an applicator 46, which surface includes protrusions 48 having outward-facing surfaces 50 coated with SAM-forming species 52. An article 48, which can be fabricated from material identical to that of stamp 46, can aid in the process. A patterned SAM on nonplanar surface 42 results, and CVD or sol-gel processing as described herein can be carried out at surface 42 in a pattern on surface 42 dictated by the SAM pattern imprinted thereon which corresponds to the pattern of protrusions 48 of applicator 46. Alternatively, surface 42 can be contoured, that is, included protrusions and intervening regions, and be rolled by a substantially planar stamp 48 so that SAM is applied selectively at outward-facing surfaces of the protrusions, alternatively followed by CVD or sol-gel deposition as described. Either arrangement can be reversed, that is, article 40 can be an applicator and article 46 can be a surface for receiving a SAM. The surface that transfers the SAM and the surface that receives the SAM will be dictated first by the surface to which the SAM is first applied, and by considerations such as adhesion of SAM to the surface that is designed to receive the SAM. A discussion of SAM-forming species and surfaces to which such species adhere is provided below.

In another technique for patterning on a nonplanar substrate, applicator 10 or 24 is flexible (e.g. made entirely of an elastomer such as PDMS), and is bent or otherwise made to conform to a nonplanar surface. This technique is applicable to any of the embodiments described herein.

The ability to transfer SAMs to nonplanar surfaces is particularly advantageous in the preparation of microelectronic devices on curved surfaces (see FIG. 10), for example microconnections between various circuit regions, the connections conforming to a bend to conserve space in an overall circuit-containing region.

In addition to sol-gel processing and CVD, application of SAMs to contoured surfaces, that is, those including protrusions (indentations) finds use in biological arenas. A SAM formed at outward-facing surfaces of protrusions of an article as illustrated in FIG. 3b, where the SAM includes an exposed functionality that is of biological interest, can be useful. For example, cytophilic SAMs allow individual cells or groups of cells to be immobilized, cultured and studied at protrusions. Alternatively, proteins or the like can be immobilized at protrusions.

A variety of different SAMs can be utilized in the techniques of the invention. For example, with reference to FIG. 3b, a SAM having a different exposed functionalities can be applied to intervening regions 36 (not shown) resulting in alternate regions of hydrophilicity and hydrophobicity, cytophilicity and cytophobicity, and the like. Alternatively, also with reference to FIG. 3b, following introduction of a different SAM (not shown) into intervening regions 36, the SAM shown could be removed from outward facing surfaces 34 via physical means, and the SAM-coated region 36 could serve as a resist to CVD or sol-gel processing, resulting in deposition selectively at outward-facing surfaces 34. Alternatively, such an arrangement could result in cell culturing, protein adsorption, or the like in intervening regions. Cells confined in intervening regions of a surface can be thereby stabilized to fluid flow over the surface.

Articles having features with very small dimensions can be fabricated in accordance with the invention. For example, a waveguide fabricated of material such as $LiNbO_3$ on a substrate such as silicon can be fabricated to have line widths smaller than 100 microns, smaller than 50 microns, smaller than 10 microns, smaller than 5 microns, smaller than 4 microns, smaller than 2 microns, smaller than 1 micron, smaller than 0.5 micron, smaller than 0.2 micron, most preferably smaller than 0.1 micron. Heights of features formed on surfaces in accordance with the invention of the above dimensions can be achieved as well, including an embodiment with lines of height smaller than 0.08 micron. The invention allows creation of material on a substrate surface with edge resolution of at least about 500 nm, preferably at least about 100 nm. As used herein, the term "edge resolution" is meant to define that an intended linear portion of a patterned material feature will deviate from a straight line in an amount less than or equal to the edge resolution value. Waveguides can be fabricated in accordance with methods of the invention that have an index gradient of greater than 0.1, 0.25, 0.5, or most preferably greater than 1 at 850 nm.

The following substrates, SAMs, applicators dimensions, other articles and features, and processes are applicable to all aspects of the invention. Selection of components and parameters can be made with reference to U.S. Pat. No. 5,512,131. The surface of the article to which a SAM of the invention is to be applied and the SAM-forming species should be selected together such that the SAM-forming species terminates at one end in a functional group that binds to the surface. In embodiments of the present invention involving CVD and sol-gel deposition it is the general physical instability of articles deposited on a SAM which allows selective patterning. Is these cases the exposed functionality of the SAM (functionality facing away from the surface) is not as important as in other embodiments such as patterning of surfaces for biological studies. However, for sol-gel processing SAMs exposing hydrophobic functionalities are preferred.

A substrate and SAM-forming molecular species are selected such that the molecular species terminates at a first end in a functional group that binds to the desired surface (substrate or film). As used herein, the terminology "end" of a molecular species, and "terminates" is meant to include both the physical terminus of a molecule as well as any portion of a molecule available for forming a bond with a surface in a way that the molecular species can form a SAM, or any portion of a molecule that remains exposed when the molecule is involved in SAM formation. A molecular species may comprise a molecule having first and second terminal ends, separated by a spacer portion, the first terminal end comprising a functional group selected to bond to a surface, and the second terminal group optionally including a functional group selected to provide a SAM on the surface having a desirable exposed functionality. The spacer portion of the molecule may be selected to provide a particular thickness of the resultant SAM, as well as to facilitate SAM formation. Although SAMs of the present invention may vary in thickness, as described below, SAMs having a thickness of less than about 50 Angstroms are generally preferred, more preferably those having a thickness of less than about 30 Angstroms and more preferably those having a thickness of less than about 15 Angstroms. These dimensions are generally dictated by the selection of the SAM-forming molecular species and in particular the spacer portion thereof.

A wide variety of surfaces (exposing surfaces on which a SAM will form) and SAM-forming molecular species are suitable for use in the present invention. A nonlimiting exemplary list of combinations of surface material and functional groups included in molecular species, such functional groups selected so as to bind to material, follows. It is to be understood, however, that any electrically conductive, electrically nonconductive, or electrically semiconductive material surface may be used in the present invention, as long as a functional group attachable to or contained within a molecular species, the functional group binding to the material, is available. Although the following list categorizes certain preferred materials for surfaces with certain preferred functional groups which firmly bind thereto, many of the following functional groups would be suitable for use with exemplary materials with which they are not categorized, and any and all such combinations are within the scope of the present invention. Preferred surface materials include metals such as gold, silver, copper, cadmium, zinc, palladium, platinum, mercury, lead, iron, chromium, manganese, tungsten, and any alloys of the above with sulfur-containing functional groups such as thiols, sulfides, disulfides, and the like; doped or undoped silicon with silanes and chlorosilanes; metal oxides such as silica, indium tin oxide (ITO), magnesium oxide, alumina, quartz, glass, and the like with carboxylic acids; platinum and palladium with nitrites and isonitriles; and copper with hydroxamic acids. Additional suitable functional groups include acid chlorides, anhydrides, sulfonyl groups, phosphoryl groups, hydroxyl groups and amino acid groups. Additional surface materials include germanium, gallium, arsenic, and gallium arsenide. Additionally, epoxy compounds, polysulfone compounds, plastics and other polymers may find use. Additional materials and functional groups suitable for use in the present invention can be found in U.S. Pat. No. 5,079,600, issued Jan. 7, 1992, and incorporated herein by reference. In one embodiment, a combination of gold as a surface material and a SAM-forming molecular species having at least one sulfur-containing functional group such as a thiols, sulfide, or disulfide is selected. The interaction between gold and such sulfur-containing functional groups is a well-studied science, and a nonlimiting representative exemplary list of such sulfur-containing functionalities may be found in an article entitled "Wet Chemical Approaches to the Characterization of Organic Surfaces: Self-Assembled Monolayers, Wetting and the Physical-Organic Chemistry of the Solid-Liquid Interface", by G. W. Whitesides and Paul E. Laibinis, Langmuir, 6, 87 (1990), incorporated herein by reference.

A SAM-forming molecular species may terminate in a second end opposite the end bearing the functional group selected to bind to particular material in any of a variety of functionalities. That is, the molecular species may include a functionality that, when the molecular species forms a SAM on a surface of the material, is exposed. Thus, according to the some embodiments the functional group would literally define a terminus of the molecular species, while according to other embodiments the functional group would not literally define a terminus of the molecular species, but would be exposed.

Such functionality may be selected to create a SAM that is hydrophobic, hydrophilic, amphipathic, that selectively binds various biological or other chemical species such as proteins, antibodies, antigens, sugars and other carbohydrates, and the like. For example, ionic, nonionic, polar, nonpolar, halogenated, alkyl, aryl or other functionalities may exist at the exposed portion of the SAM. A nonlimiting, exemplary list of such functional groups includes those described above with respect to functional group attachment to the surface in addition to: —OH, —CONH—, —CONHCO—, —NH$_2$, —NH—, —COOH, —COOR, —CSNH—, —NO$_2^-$, —SO$_2^-$, —RCOR—, —RCSR—, —RSR, —ROR—, —PO$_4^{-3}$, —OSO$_3^{-2}$, —SO$_3^-$, —NH$_x$R$_{4-x}^+$, —COO$^-$, —SOO$^-$, —RSOR—, —CONR$_2$, —(OCH$_2$CH$_2$)$_n$OH (where n=1–20, preferably 1–8), —CH$_3$, —PO$_3$H$^-$, -2-imidazole, —N(CH$_3$)$_2$, —NR$_2$, —PO$_3$H$_2$, —CN, —(CF$_2$)$_n$CF$_3$ (where n=1–20, preferably 1–8), olefins, and the like. In the above list, R is hydrogen or an organic group such as a hydrocarbon or fluorinated hydrocarbon. As used herein, the term "hydrocarbon" includes alkyl, alkenyl, alkynyl, cycloalkyl, aryl, alkaryl, aralkyl, and the like. The hydrocarbon group may, for example, comprise methyl, propenyl, ethynyl, cyclohexyl, phenyl, tolyl, and benzyl groups. The term "fluorinated hydrocarbon" is meant to refer to fluorinated derivatives of the above-described hydrocarbon groups. Additionally, R may be a biologically active species such as an antigen, antibody, hapten, etc. Such embodiments are described below, and attachment of such biologically active groups to molecular species 28 is known to those of ordinary skill in the art.

As noted above, a molecular species may form a SAM having exposed functionality including hydrophobic, hydrophilic, and amphipathic functionality, that selectively binds various biological or other chemical species such as proteins, antibodies, antigens, sugars and other carbohydrates, and the like. The exposed functionality may comprise a member of any specific or non-specific binding pair, such as either member of the following non-limiting list: antibody/antigen, antibody/hapten, enzyme/substrate, enzyme/inhibitor, enzyme/cofactor, binding protein/substrate, carrier protein/substrate, lectin/carbohydrate, receptor/hormone, receptor/effector, complementary strands of nucleic acid, repressor/inducer, or the like.

The central portion of molecules comprising SAM-forming molecular species generally includes a spacer functionality connecting the functional group selected to bind to a surface and the exposed functionality. Alternately, the spacer may essentially comprise the exposed functionality, if no particular functional group is selected other than the spacer. Any spacer that does not disrupt SAM packing and that allows the SAM layer to be somewhat impermeable to various reagents such as etching and plating reagents, as described below, in addition to organic or aqueous environments, is suitable. The spacer may be polar, nonpolar, positively charged, negatively charged, or uncharged. For example, a saturated or unsaturated, linear or branched alkyl, aryl, or other hydrocarbon spacer may be used, as well as corresponding halogenated hydrocarbons, especially fluorinated hydrocarbons.

Thus, the molecular species generally comprises a species having the generalized structure R'—A—R", where R' is selected to bind to a particular surface of material, A is a spacer, and R" is a group that is exposed when the species forms a SAM. Also, the molecular species may comprises a species having the generalized structure R"—A'—R'—A—R", where A' is a second spacer or the same as A, or R'"—A'—R'—A—R", where R'" is the same or different exposed functionality as R". Additionally, species such as R'—A—R"—B and B—R'"—A'—R'—A—R"—B" may be chosen, where B and B' are similar to A, do not prevent exposure of R'" and R" to the surrounding environment, and may be the same or different. It is to be understood that, in the above generalized formulas, A and R" or R'" may not be distinguishable, but may be continuous. For example, when A comprises an alkyl chain, and R" or R'" comprises an alkyl functionality, A and R" or R'" together may simply define an alkyl chain. One class of molecules suitable for use as a SAM-forming molecular species, when to be SAM-derivatized comprises gold, silver, and copper, are the omega-functionalized thiols, that is, those having the generalized structure R'—A—R", where R'=—SH, A=—(CH$_2$)$_n$— where n=1–30, preferably 1–20, and R"=—CH$_3$; —OH; —O(CH$_2$)$_n$H, where n=1–15, preferably 1–7; —CONH(CH$_2$)$_n$H, where n=1–15, preferably 1–7; —NHCO(CH$_2$)$_n$H, where n=1–15, preferably 1–7; —(OCH$_2$CH$_2$)$_n$H, where n=1–15, preferably 1–7; and —COOH.

A surface to be coated with SAM may comprise its own substrate, or may be a thin film deposited upon a substrate.

Where a separate substrate is employed, it may comprise any biological, nonbiological, organic, or inorganic material, or a combination of any of these. The substrate can be formed of a conductive, nonconductive, semiconducting material, or the like, and may comprise glass, silica, alumina, plastic or other organic polymers for example acrylonitrile-butadiene-styrene copolymers, polysulfone, polystyrene, metals, or any of the above materials described with respect to other material of the present invention. The substrate may also comprise a bioerodable material such as, for example, poly(glycolic acid), polyanhydrides, polyorthoesters, polylactic acid, or combinations thereof. The substrate may include a bonding layer, for example a thin titanium film, to promote adhesion between a layer of material to be SAM-coated and the substrate.

SAM-forming molecular species may be coated onto the stamping surface by any convenient method. For example, the molecular species can be absorbed into a piece of paper, and the stamping surface of applicators 10, 24, 40, or 46 then pressed against the piece of paper. A cotton swab or the like also may be used to transfer the molecular species to the stamping surface. Alternatively, the stamping surface can be coated followed by shearing off excess, that is, the SAM-forming molecular species can be spin coated on the stamping surface. The molecular species may be very rapidly transferred to the stamping surface. For example, contacting the stamping surface with a molecular species for a period of time of approximately 2 seconds is adequate to effect the sufficient transfer where a relatively concentrated solution of SAM-forming molecular species in solvent is used. Where a more dilute solution is used, longer times may be required.

Generally, the molecular species is dissolved in a solvent for transfer to a stamping surface. The concentration of the molecular species in such a solvent for transfer should be selected to be low enough that the species is well-absorbed into the stamping surface, and high enough that a well-defined SAM may be transferred to a material surface without blurring. Typically, the species will be transferred to a stamping surface in a solvent at a concentration of less than 100 mM, preferably from about 0.5 to about 20.0 mM, and more preferably from about 1.0 to about 10.0 mM. Any solvent within which the molecular species dissolves, and which may be carried (e.g. absorbed) by the stamping surface, is suitable. In such selection, if a stamping surface is relatively polar, a relatively polar and/or protic solvent may be advantageously chosen. If a stamping surface is relatively nonpolar, a relatively nonpolar solvent may be advantageously chosen. For example, toluene, ethanol, THF, acetone, isooctane, diethyl ether, and the like may be employed. When a siloxane polymer is selected for fabrication of a stamp, and in particular stamping surface, toluene ethanol, acetone, and diethyl ether are preferred solvents. The use of such an organic solvent generally aids in the absorption of SAM-forming molecular species by a stamping surface. When the molecular species is transferred to the stamping surface, either near or in a solvent, the stamping surface should be dried before the stamping process is carried out. If a stamping surface is not dry when the SAM is stamped onto the material surface, that is, if gross liquid remains on the stamping surface, blurring of the SAM can result from dispersion of the liquid from under the stamping surface. The stamping surface may be air dried, blow dried, or dried in any other convenient manner. The drying manner should simply be selected so as not to degrade the SAM-forming molecular species.

According to embodiments of the present invention in which a self-assembled monolayer is formed on silicon dioxide or glass, including aspects of the invention involving the preparation of surfaces of biological interest, a flat or contoured surface such as a silicon dioxide or glass slide or petri dish can be patterned with a self-assembled monolayer of alkylsiloxane that exposes a chemical functionality of interest (for example biological interest, facilitating biological studies at that surface for example at protrusions if the surface is contoured). For example, a self-assembled monolayer of alkylsiloxane terminating in a cytophilic functionality can be patterned onto a silicon dioxide or glass surface in accordance with the invention, followed by adherence or inmmobilization of a cell or cells to the cytophilic functionality. Biological, specifically cytophilic, functionalities in association with self-assembled monolayers are described in copending, commonly-owned application Ser. No. 08/131, 841 and in an article entitled "Engineering Cell Shape and Function", by Singhvi, R., et al. *Science,* 264, 696 (1994), both incorporated herein by reference. This article describes the formation of islands of self-assembled monolayer terminating in a non-polar functionality ($-CH_3$) surrounded by regions of polyethylene glycol-terminating self-assembled monolayer. The non-polar terminal functionality of the islands is protein adherent, while the polyethylene glycol functionality is not protein-adherent. Exposure of a surface derivatized as such to a protein matrix such as the purified extracellular matrix protein laminin results in cytophilic, protein-coated islands surrounded by cytophobic regions. Exposure of this surface to cells results in cell attachment preferentially to the adhesive (cytophilic), laminin-coated islands and the cells are prevented from extending onto surrounding non-adhesive (cytophobic) regions. Alternatively, a surface derivatized as described above with a patterned, self-assembled monolayer terminating in non-polar, such as methyl, functionality can be contacted with a cell or cells without first treating the surface with a protein matrix such as laminin. According to some embodiments, the cell or cells will secrete a protein matrix such as laminin that will coat the exposed non-polar functionality, and the cell or cells then will adhere thereto.

According to some embodiments of the invention the above-described techniques involving patterning glass or silicon dioxide can be applied to other polar surfaces including polar polymeric surfaces such as oxidized polyethylene or polystyrene. According to these embodiments alkylsiloxane can be patterned onto a polymeric surface oxidized for example via plasma etch to expose polar functionalities such as hydroxyl, carboxylic acid, aldehyde, or the like. These surfaces can form the basis for all embodiments of the invention described herein, including the biological aspects described above.

Patterning of alkylsiloxane onto glass, silicon dioxide, or polar polymeric surfaces can be carried out according to chemistry known to those of skill in the art. For example, trichlorosilane or trialkoxysilane such as triethoxysilane, when applied to these surfaces in essentially any solvent in which they can be carried (such as water, hexane, toluene, and the like) will form alkylsiloxane on that surface.

The techniques described above involving patterning of alkylsiloxane on glass, silicon dioxide, or polar polymeric surfaces can be carried out on planar or non-planar surfaces, as described herein, and can be combined with techniques described herein involving allowing alkylsiloxane or its precursor to spread onto the surface while contacting the surface simultaneously with a species that is not compatible with the alkylsiloxane or precursor, and involving deforming a stamp from which the alkylsiloxane or precursor is transferred, or both.

According to some embodiments of the invention, features (such as outward-facing surfaces of protrusions of a stamp or substrate, or lateral dimension of a SAM or CVD or sol-gel product) have a lateral dimension of less than about 10 microns. According to other embodiments, features may have a lateral dimension of less than about 5, 2, 1, 0.5, or 0.25 microns. According to a particularly preferred embodiment, features have a lateral dimension of less than 0.2 microns. As used herein, the term "lateral dimension" is meant to define the distance across any portion of a SAM surface that differs in any way from its surrounding environment, or corresponding dimensions of CVD or sol-gel products. Such differences may be chemical, physical, or biological. When viewing a surface directly, a lateral dimension would be a dimension of a SAM perpendicular to the line of sight.

According to another embodiment of the invention, the area of such features is relevant. For example, a feature area of less than about 10,000 square microns can be provided, although areas of much more than this are within the scope of the present invention. Such a feature may have an area of less than 1,000, 100, 40, 25, 2, 1 or 0.06 square microns.

The applicators 10, 24, 40, or 46 can be formed in a variety of ways. A stamp can be formed by contacting a mold surface with a hardenable material, typically a fluid, which serves as a precursor of the stamp. The fluid is hardened, for example by ionic, nonionic, or free-radical polymerization to form a stamp having a surface contacting the mold surface. The mold surface can be selected to include at least one protrusion, and when the stamp is removed from mold surface, a stamp having a stamping surface including an indentation corresponding to the mold surface protrusion results (or a plurality of indentations corresponding to a plurality of protrusions results). According to other embodiments, a flat mold surface results in a flat stamp.

The particular material chosen for formation of the stamp should satisfy certain physical characteristics. The stamp can be elastic, such that the stamping surface may very closely conform to minute irregularities in a surface of material so as to completely transfer SAM-forming molecular species thereto, and so as to be amenable to transferring SAMs of molecular materials to nonplanar surfaces. In another embodiment, the applicator has a surface that contacts the substrate that is conformable, but the remainder of the applicator is not elastic or conformable.

The applicator should also be formed such that the stamping surface is made of absorbent material selected to absorb SAM-forming molecular species to be transferred to a surface to form a SAM thereon. The stamping surface preferably swells to absorb SAM-forming molecular species, and/or to absorb the molecular species dissolved or suspended in a carrier such as an organic solvent. Such swelling and absorbing characteristics serve the important function of providing good definition of an isolated SAM on a surface. For example, if a dimensional feature of a stamping surface or surface to be coated with SAM includes a substantially square-shaped feature, the stamping surface should transfer SAM-forming molecular species to the surface of the substrate material so as to form SAMs mirroring the substantially square features of the stamping surface, without blurring. Such blurring can result from selection of a stamp which does not absorb the SAM-forming molecular species or its carrier. According to the stamp of the present invention, SAM-forming molecular species, optionally in a carrier, is absorbed into the stamping surface, and when the stamping surface contacts a substrate surface, the molecular species is not dispersed, but binds to the surface, and removal of the stamping surface from the substrate surface results in well-defined SAM features.

Additionally, the stamp should be fabricated such that the stamping surface is free of any leachable materials such as plasticizers that would interfere with or contaminate the SAM. For example, if additives are included in the material used to fabricate the stamp, such additives should be bound to the internal structure of the stamp.

According to a preferred embodiment, the stamp is formed from a polymeric material. Polymeric materials suitable for use in fabrication of the stamp may have linear or branched backbones, and may be crosslinked or noncrosslinked, depending upon the particular polymer and the degree of formability desired of the stamp. A variety of elastomeric polymeric materials are suitable for such fabrication, especially polymers of the general classes of silicone polymers, epoxy polymers, and acrylate polymers. Epoxy polymers are characterized by the presence of a three-member cyclic ether group commonly referred to as an epoxy group, 1, 2-epoxide, or oxirane. For example, diglycidyl ethers of bisphenol A may be used, in addition to compounds based on aromatic amine, triazine, and cycloaliphatic backbones. Another example includes the well-known Novolac polymers. Materials which may not be suitable for fabrication of a stamping surface according to preferred embodiments include polyethylene and polystyrene, which are generally too brittle, and polybutadiene, which is generally too elastic.

Examples of silicone elastomers suitable for use as a stamp include those formed from precursors including the chlorosilanes such as methylchlorosilanes, ethylchlorosilanes, and phenylchlorosilanes, and the like. A particularly preferred silicone elastomer is polydimethylsiloxane. Exemplary polydimethylsiloxane polymers include those sold under the trademark Sylgard by the Dow Chemical Company, Midland Michigan, and particularly Sylgard 182, Sylgard 184, and Sylgard 186.

The invention involves, as one aspect, forming a blocking agent pattern on a substrate surface that serves as a mask to CVD, sol-gel processing, or the like. The blocking agent can be a SAM, as described above, or another species such as a polymeric material. SAMs can become polymeric materials when selected appropriately. For example, where organosilanes that are polymerizable are selected to form patterned SAMs on a surface, they can be made to crosslink at the surface. For example, a polymerizable organosilane can be applied to a stamping surface of an applicator and the stamping surface of the applicator held in contact with a surface to be derivatized for an extended period of time. Especially at high concentrations of cross-linkable organosilane, and long contact times between applicator and the surface, multi-layer, polymeric material can result. Thus, the invention involves applying a blocking agent, or mask, directly to a substrate surface in a pattern, and depositing the material in a surface complementary to the pattern via CVD, sol-gel processing, or the like. The blocking agent can be applied in a pattern corresponding to an applicator stamping surface pattern, as illustrated in FIGS. 1 and 2, or in a pattern dictated by the contoured surface of the substrate to receive the blocking agent, as illustrated in FIG. 3.

U.S. patent application Ser. No. 08/616,929 of Kim, et al., entitled "Method of Forming Articles and Patterning Surfaces via Capillary Micromolding" incorporated herein by reference, describes a number of techniques for patterning surfaces with materials that can serve useful in the present invention as blocking agents or masks for pattern-selective CVD and/or sol-gel processing. Such species, or precursors of such species (which may require additional chemical reactions to form blocking agents) can be transferred from an applicator via the technique illustrated in FIGS. 1–4 to a flat, curved, or contoured surface, or can be transferred from indentations in a contoured stamping surface of the applicator where a precursor of the blocking agent is contained in a fluid state that can be carried in the indentations. Alternatively, in a technique described in the above-referenced Kim, et al. application, an applicator having indentations can be placed against a surface of a substrate whereby channels are defined in a pattern at the surface by portions of the surface and the indentations of the applicator. These channels can be filled via capillary action by a fluid precursor of a blocking agent or a fluid containing a precursor of a blocking agent. Following formation of the blocking agent at the surface via polymerization, concentration and hardening by solvent or carrier diffusion, or the like, the applicator (serving as a micromold in this arrangement) can be removed. Alternatively, the applicator can be removed and the blocking agent formed or hardened, if not already in final, blocking form. Pressure or vacuum can be used to facilitate flow of fluid into such channels. In this embodiment, the precursor must be of a viscosity allowing flow of the precursor into the channels. Those of ordinary skill in the art can determine, without undue experimentation, which fluids will readily flow into such channels based upon dimension of the channels and viscosity of the fluid. In most instances, the viscosity of the fluid can be adjusted, for example by diluting or concentrating the fluid, to achieve a level of viscosity suitable for flow into the channels at a desired rate. The polarity of the fluid can be tailored as well, with reference to the chemical characteristic of the substrate surface or applicator, to facilitate fluid carrier flow.

In one example of such an technique, and with reference to FIG. 1a, a fluid precursor of a blocking agent is a solution of monomer in a fluid carrier and is polymerized at the surface of substrate 18 with article 10 in place upon the substrate. Article 10 then is removed, resulting in a polymeric blocking agent on the surface of substrate 18 in a pattern corresponding to the pattern of indentations of the applicator. The pattern can be linear or non-linear, can differ in cross-section, and can include isolated regions and/or connected regions. The pattern can be formed on a nonplanar surface by bending the applicator to conform to the surface or, where a fluid precursor of the blocking agent is contained in channels of the applicator and transferred to the surface, the applicator can be rolled over the surface (or the surface rolled over the applicator. This structure can be thermally polymerized on the substrate surface by heat, photopolymerized if the substrate 18 or applicator 10 is transparent to polymerizing radiation, or polymerized following removal of applicator 10 via heat or photolysis. Free-radical polymerization can be carried out as well. These and other forms of polymerization, including cationic, anionic, copolymerization, chain polymerization, cross-linking, and the like can be employed, and essentially any type of polymer or copolymer formable from a fluid precursor can be patterned on the surface of a substrate in accordance with the invention.

An exemplary, non-limiting list of polymers that are suitable for forming blocking agents include urethane polymers, polyamides, polycarbonates, polyacetylenes and polydiacetylenes, polyphosphazenes, polysiloxanes, polyolefins, polyesters, polyethers, poly(ether ketones), poly (alkylene oxides), poly(ethylene terephthalate), poly(methyl methacrylate), polystyrene, and derivatives and block, random, radial, linear, or teleblock copolymers, cross-linkable materials such as proteinaceous material and/or blends of the above. Gels are suitable where dimensionally stable enough to maintain structural integrity upon removal of applicator 10 from the surface of substrate 18. The particular polymer, copolymer, blend, or gel selected is not critical to the invention, and those of skill in the art can tailor a particular material for any of a wide variety of applications.

Alternatively, a blocking agent precursor such as a polymerizable or cross-linkable species can entirely coat the surface of substrate 18, and applicator 10 then can be pressed against the surface of substrate 18 (and/or rolled against a curved substrate) to form the precursor into a pattern corresponding to the indentation pattern of the applicator.

According to another embodiment, the blocking agent or mask is not a polymer or cross-linked organic species as described above, but is a non-polymerized organic or inorganic species that is dissolved or dispersed in a fluid carrier to form a fluid precursor introduced into channels created between applicator 10 and the surface of substrate 18, whereupon the fluid carrier or solvent dissipates (e.g., is removed via evaporation from the channels and/or absorption into the applicator 10).

Where it is desired to pattern the surface of the substrate with a material via CVD or sol-gel processing and subsequently to remove the blocking agent or mask from the surface, the blocking agent or mask should be selected in conjunction with the substrate surface and the material to be deposited via CVD or sol-gel processing such that the blocking agent can be removed selectively. For example, where a polymerizable material is deposited on a substrate surface in a pattern and polymerized thereon, followed by CVD or sol-gel deposition of a material in a pattern complementary to the blocking agent pattern, the polymerized blocking agent can be selected so as to be removable by a solvent to which the material pattern on the substrate is inert, or degraded and removed via radiation that does not destroy the material pattern. Photoresist can be used as the blocking agent in this embodiment and, following CVD or sol-gel processing, irradiated and removed. Selection of such materials and conditions is within the level of ordinary skill in the art.

In another embodiment, a SAM is applied to a surface in a pattern, a blocking agent precursor (a prepolymer, for purposes of illustration) is applied to the surface in a pattern dictated by the SAM pattern, the prepolymer is crosslinked or polymerized at the surface, and the resulting polymer thereby defines a blocking agent that dictates a pattern of deposition via CVD or sol-gel processing. The use of a SAM to direct patterned deposition of a polymer at a surface is described in U.S. patent application Ser. No. 08/676,951, referenced above, and its counterpart, international application no. PCT/US96/03073, filed Mar. 1, 1996 and incorporated herein by reference. In this arrangement, the self-assembled monolayer is patterned onto the substrate surface using any method described herein or other method known to those of ordinary skill in the art. A prepolymer solution then is applied to the surface and, where the prepolymer solution is compatible with the exposed functionality of the self-assembled monolayer and incompatible with the surface of the substrate, the prepolymer solution assembles on the SAM in a pattern that corresponds to the SAM pattern. The prepolymer then can be polymerized. Where the prepolymer is compatible with the substrate surface, but incompatible with the functionality exposed by the SAM, the prepolymer will assemble in a pattern complementary to the pattern of the SAM, and can be polymerized as such. Where the prepolymer is polymerized in a pattern complementary to that of the SAM, the polymer is selected to be robust under conditions in which the SAM is removed and the prepolymer thereby directs deposition of material, via CVD or sol-gel processing, in a pattern complementary to that of the polymeric blocking agent, and in a pattern corresponding to the original SAM pattern. In this arrangement, if the chemical functionality exposed by the SAM is significantly polar, then the prepolymer should be relatively polar if it is desired that the blocking agent be formed on the SAM. Polar/nonpolar characteristics of a particular surface, SAM, and prepolymer can be selected and tailored in this technique to direct a blocking agent as desired. As in the above arrangement in which a polymeric blocking agent is formed in a pattern on the surface, in this arrangement if it is desired to provide a surface carrying solely a material deposited via CVD or sol-gel processing, the polymeric blocking agent is selected to be removable under conditions in which the deposited material remains.

The function and advantage of these and other embodiments of the present invention will be more fully understood from the examples below. The following examples are intended to illustrate the benefits of the present invention, but do not exemplify the full scope of the invention.

EXAMPLE 1

Sol-gel Process for Deposition of Material Patterns Dictated by SAMs

Sol-gel precursor solutions were synthesized from metal alkoxides in alcoholic solutions. Two previously-investigated chemical systems were used in this example: (1) a lithium niobium ethoxide solution in ethanol as a precursor for LiNbO$_3$ (Eichorst, et al., *Inorg Chem.* 29, 1458 (1990)), and (2) a lead lanthanum titanium precursor in propanediol as a precursor for PLT (Ali et al., *J. Mat. Sci. Lett.* (1995)). LiNb(OCH$_2$CH$_3$)$_6$ was synthesized and dissolved in absolute ethanol to form 0.3 M solutions suitable for spin casting on sapphire and SiO$_2$/Si substrates. PLT films were derived from a dihydroxy alcohol route and diluted to 0.3 M in isopropanol for deposition on SiO$_2$/Si and ITO/SiO$_2$/Si.

With reference to FIG. 1 a polydimethylsiloxane (PDMS) applicator 10 was fabricated as described in U.S. Pat. No. 5,512,131, incorporated by reference above. The stamp had a contoured surface as illustrated in FIG. 1a. The stamp was coated with a solution of octadecyltrichlorosilane (OTS) in hexane (0.2–25 mM). A photoresist spinner used to coat the stamp was found to provide consistent, nearly defect-free transfer of the pattern. The details of the patterning process and the nature of the SAMs obtained have been reported previously (Kumar, et al., *Appl. Phys. Lett.* 63, 2002 (1993); Kumar, et al., *Langmuir* 10, 1498 (1994); Wilbur, et al., *Adv. Mat.* 6, 600 (1994)).

Inert substrates such as sapphire were modified with a water plasma before SAM formation to promote adhesion of the SAM. The substrates were treated in DC water plasma for 15 seconds at 50 Watts and 1,000 mtorr.

Sol-gel solutions were spun cast on OTS patterned substrates at 3,000 rpm for 30 seconds. Pyrolysis of thin layers at 350° C. allowed removal of organic species, yielding 80 nm LiNbO$_3$ and 300 nm PLT amorphous oxide thin layers, as determined by surface profilometry and SEM.

After pyrolysis, regions of a amorphous layers above the SAM were severely cracked and showed poor adhesion. In contrast, well-bound continuous layers 19 were formed above underivatized regions 22. The loosely-adhered layers were selectively removed by mild mechanical abrasion with cotton felt wetted with isopropanol. The remaining patterned material was crystallized at 600° C.

Figure 5A:
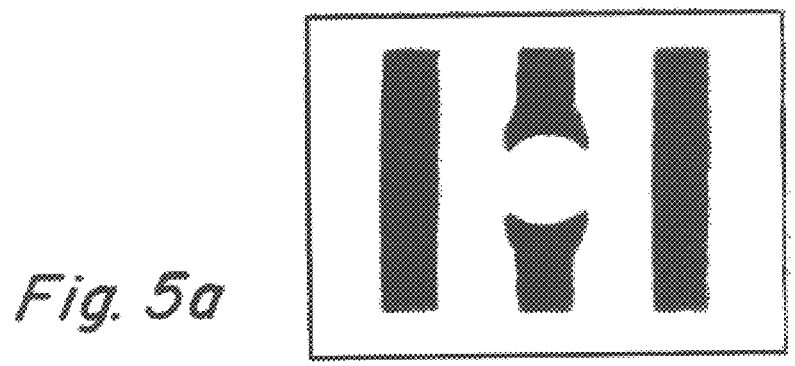
Figure 5B:
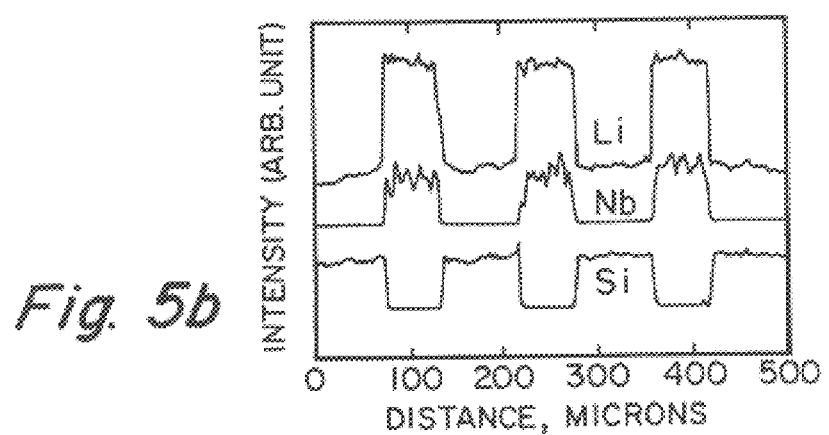

FIG. 5a is a photocopy of an optical micrograph of patterned LiNbO$_3$ on a Si substrate surface (lines 60 µm in width separated by 80 µm). Selectivity of the deposition is clearly demonstrated by Auger electron spectroscopy (AES) line scans made across the imaged region (FIG. 5b).

Figure 6A:
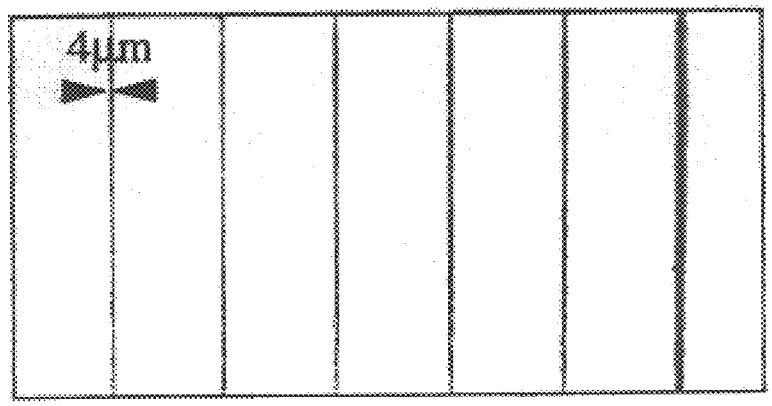
FIGS. 6a–6c are photocopies of (a) strip waveguides of $LiNbO_3$, with widths from 4 $\mu$m to 40 $\mu$m, (b) illumination of patterned strip waveguides 4 $\mu$m to 120 $\mu$m in width, and © excitation of $TE_o$ mode in 120 $\mu$m wide, 80 nm strip waveguides.
Figure 6B:
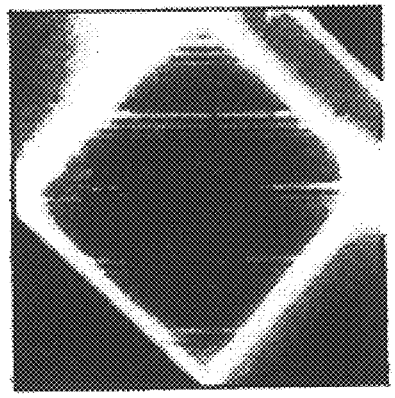
Figure 6C:
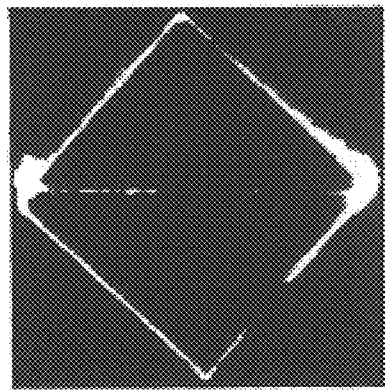
Figure 7A:
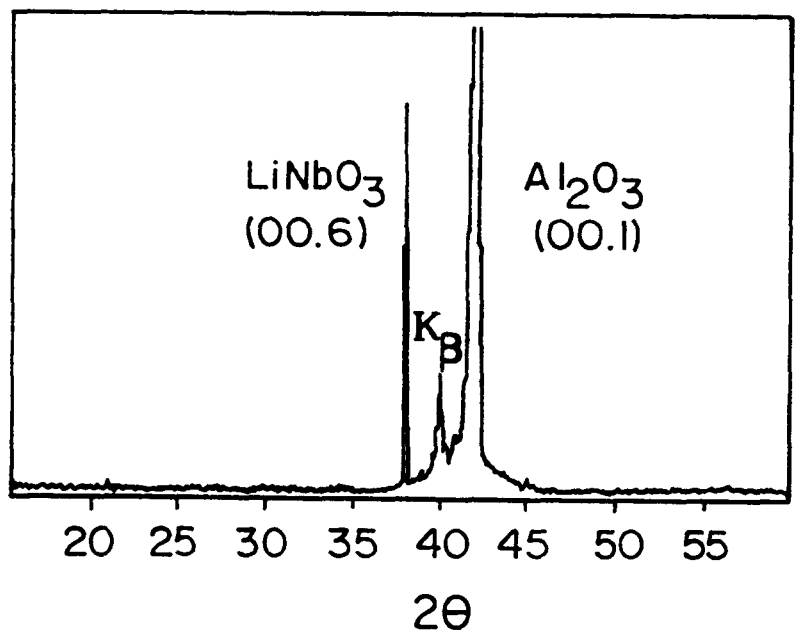
FIGS. 7a and 7b are (a) Cu, K$\infty$0–20 x-ray diffraction patterns of $LiNbO_3$ on sapphire and (b) a rocking curve of (00.L) $LiNbO_3$.
Figure 7B:
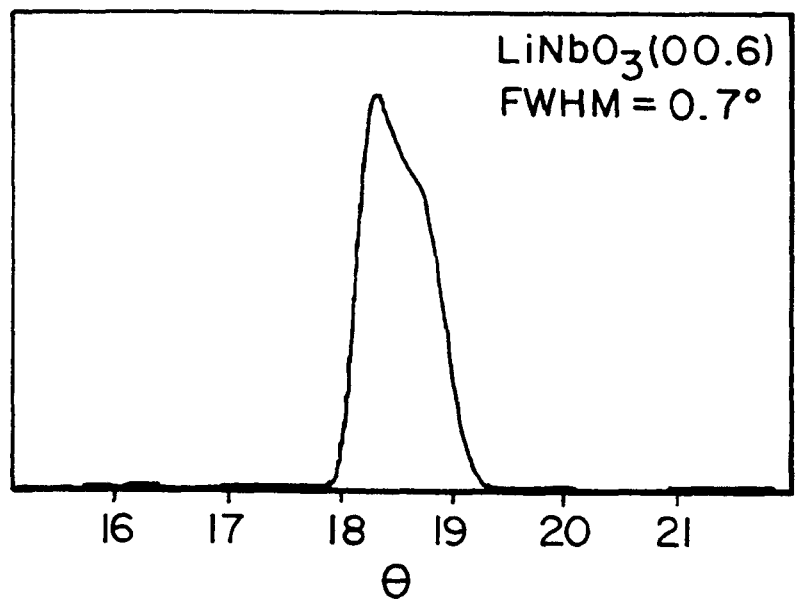

FIG. 6a is a photocopy of an optical micrograph of patterned LiNbO$_3$ lines on Si substrates. The line widths present in this structure range from 120 µm to 4 µm. The same pattern was used to form LiNbO$_3$ strip waveguides on sapphire as shown in FIGS. 6b and 6c. Fast firing of the LiNbO$_3$ strips developed heteroepitaxial (00.6) oriented LiNbO$_3$ on (00.1) sapphire substrates, as demonstrated by the x-ray data of FIG. 7a. Rocking curve half widths of below 1° further indicate the high degree of orientation achieved (FIG. 7b).

Figure 8A:
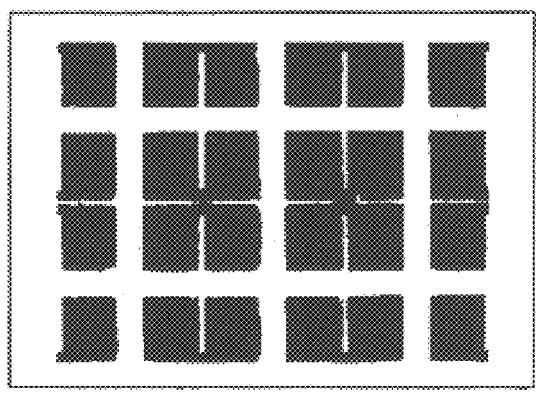
FIGS. 8a–8c are photocopies of (a) patterned $Pb_{1-3x/2}La_xTiO_3$ (PLT) pads with 200 $\mu$m widths fabricated in accordance with the invention suitable for decoupling capacitor applications, (b) x-ray data of PLT (1%) on ITO indicating tetragonal ferroelectric phase, and © x-ray data of PLT (28%) on ITO indicating a cubic paraelectric phase with diffuse phase transformation.
Figure 8B:
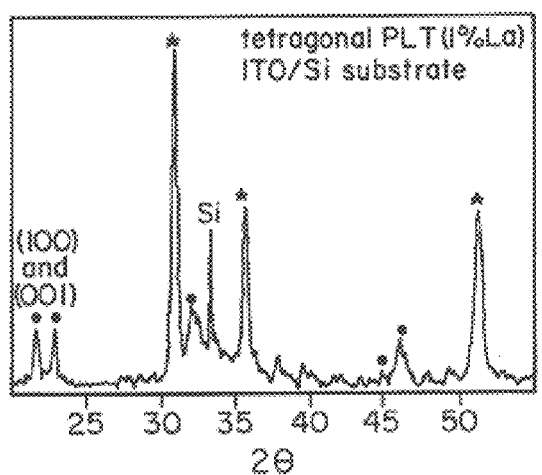
Figure 8C:
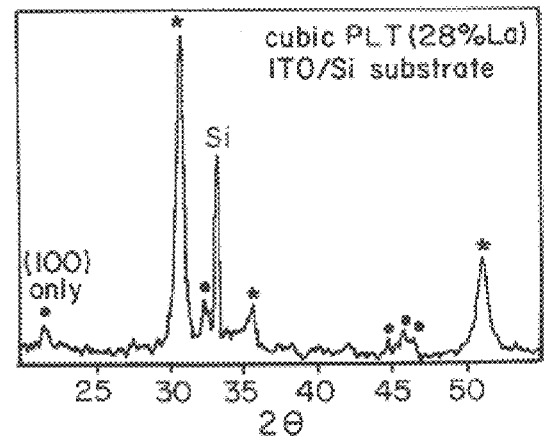

Pads of Pb$_{1-3x/2}$La$_x$TiO$_3$ (PLT) with x=1% and 28% were patterned on Si substrates (the Si substrates were p-type, (110) orientation with 20–25 angstrom native oxide). Patterning was carried out as illustrated schematically in FIGS. 1a–1d. As described in U.S. Pat. No. 5,512,131, a stamp including protrusions of parallel lines was first applied to the surface, removed and rotated 90°, and reapplied. Sol-gel deposition was carried out as described above. A photocopy of an optical micrograph of the resulting pattern appears in FIG. 8a. For capacitance measurements PLT listed positive on ITO/Si substrates. X-ray analysis of these samples show the presence of PLT and ITO peaks only (FIGS. 8b and 8c). PLT (1% La) is a ferroelectric, tetragonal unit cell material which exhibits splitting of the (100) and (001) peaks. In contrast, PLT (28% La) is a paraelectric, cubic cell material with a single cubic (100) peak. PLT (28%) is a candidate material for DRAM applications because of a low leakage current and a high dielectric constant. Dielectric characterization was performed after application of gold top electrodes by sputtering. The article showed good electrical properties.

EXAMPLE 2

CVD in Patterns Dictated by SAM Patterns

This example demonstrates the formation of patterned structures of copper, using CVD from a source gas of (hexafluoroacetylacetonato)copper(I)vinyltrimethylsilane) on substrates whose surfaces have been patterned by a monolayer of alkylsiloxane. The procedure is illustrated schematically in FIGS. 2a–2c and 3a–3c. PDMS applicators 10 and 24 were coated with a solution of OTS in hexane or toluene (0.2–2 mM). High-quality SAMs were successfully formed by printing on a range of substrates including materials (Al Si, and TiN) bearing a native oxide overlayer, glasses (glass microscope slides, ITO, and polymers (pyromellitic dianhydride oxydianiline polyamide) whose surfaces had been modified by plasma treatment.

FIG. 9a is a photocopy of an SEM image of a patterned SAM of OTS on a planar surface of Al/Al$_2$O$_3$, achieved using the technique as illustrated in FIGS. 2a–2b. (Lopez, et al., *Langmuir,* 9, 1513–1516 (1993)).

Following deposition of copper via CVD as illustrated schematically in FIG. 2c, copper lines in a pattern complementary to the SAM pattern resulted, as shown in FIG. 9b which is a photocopy of a SEM image of this copper pattern.

The selectivity of the deposition is evidenced by the AES line scan shown in FIG. 9c of the pattern of FIG. 9b.

CVD deposition of copper in a pattern dictated by a SAM pattern on a surface including a plurality of indentations, as illustrated schematically in FIGS. 3a–3c, was carried out. FIG. 10a is a photocopy of an SEM image of CVD of copper on a surface as illustrated in FIG. 3a, without SAM protection. FIG. 10b is a photocopy of an SEM image of CVD of copper on a similar structure, the outward-facing surface of protrusions of which was protected with a SAM as illustrated in FIGS. 3b and 3c.

FIG. 10c is a photocopy of an SEM image of a flat substrate through which 0.7 μm holes were drilled. A flat PDMS applicator coated with OTS in hexane was applied to the flat substrate, resulting in protection of the exposed surface of the substrate by the SAM, but without protection of the holes. Exposure to CVD conditions resulted in copper depositions selectively in the holes.

EXAMPLES 3 AND 4

Variable Throughput CVD at SAM-Patterned Surfaces Resulting in Directed Selective Deposition, or Blanket Deposition Followed by Lift-off A copper CVD precursor, copper hexafluoroacetylacetonate vinyltrimethylsilane was obtained from Schumacher Company (Carlsbad, Calif.). ITO substrates were obtained from Donnelly Applied Films (Denver, Colo.). Titanium nitride substrates (600 Angstroms thick sputtered TiN on Si) were obtained from Hyundai Electronics, Ltd. Octadecyltrichlorosilane (OTS) was obtained from Aldrich and used without further purification.

PDMS applicators used for microcontact printing were fabricated according to U.S. Pat. No. 5,512,131, referenced above. Substrates (TiN, ITO, $SiO_2$, $Al_2O_3$ and glass) were washed with deionized water, acetone, isopropanol, and dried with a stream of argon. The dried substrates were placed in a UV/ozone generator for five to ten minutes to remove trace organic contaminants (and in some instances to effect very thin oxide growth) immediately prior to microcontact printing with OTS. A solution of OTS in dry hexane (10 mM) was used as "ink" to be applied to the applicator. The OTS solution was applied to the PDMS stamp using a photoresist spinner (3000 rpm for 30 seconds) and dried in a stream of argon for approximately 30 seconds. The stamp was brought into contact with the substrate (by hand) and held in place for about 30 seconds. This procedure routinely yielded OTS thin films with approximately 25–30 Angstroms mass coverages on the substrates examined.

After printing, copper thin films were deposited via CVD. The chemical vapor deposition experiment was carried out in a home-built, cold-wall reactor. The reactor included a stainless steel chamber pumped by a diffusion pump to a base pressure of less than or equal to $1 \times 10^{-7}$ Torr. Copper films were typically deposited on one square inch substrates. The substrates were cleaned with deionized water and isopropanol and finally dried with a stream of argon before loading into the reactor. The copper precursor was carried into the reactor using argon as the carrier gas (flow rate of 5–150 sccm) and delivered to the susceptor region where the substrate was held between 150–300° C. The temperature of the susceptor was regulated to within + or −2° C. using a programmable power supply. A typical deposition took approximately 10–20 minutes to carry out. The chamber pressure was maintained at a pressure value between 100 mTorr and 1 Torr using a throttle valve. Film thicknesses were determined by profilometry. Patterned copper films were characterized by electron and optical microscopy, energy dispersive X-ray analysis, X-ray photoelectron and Auger electron spectroscopies.

EXAMPLE 3

Low Throughput, Selective Deposition

At CVD conditions of 175° C. with low source pressure (300 mTorr) and at a deposition rate of approximately 200 Angstroms per minute, 3,000 Angstroms thick copper film, deposited selectively in a pattern complementary to that of the SAM pattern resulted. FIG. 11 is a photocopy of a microscopic image of a 1 square inch ITO substrate patterned as described. The process routinely yielded high resolution features (as small as 0.5 microns) over large areas. The sizes of the copper features deposited in the demonstration of FIG. 1 range from 5 to 250 microns.

EXAMPLE 4

High Throughput CVD Process Followed by Lift-off

A procedure was carried out as described above, but at high throughput values of 250° C. and chamber pressure of 1 Torr. The deposition rate was approximately 800 Angstroms per minute. After application of an SAM and exposure to CVD conditions, copper was essentially blanket-deposited on the surface as illustrated in FIG. 12a. It is evident from FIG. 12a that the coherence of the copper film was poor above the SAMs, with many features of the SAMs being visible. This illustrates significant heterogeneity of the activated nucleation rates for deposition on this surface. Profilometry revealed that copper film in the non-SAM bearing regions was 1 micron thick. A mild polishing on a cotton felt wetted with isopropanol removed material deposited atop the SAMs, to reveal the intricate patterns of copper features as illustrated in the photocopy of the micrograph of FIG. 12b. Features with dimensions ranging from 5 to 250 microns are clearly visible.

EXAMPLE 5

Formation of Patterned, Polymeric Blocking Agent on a Surface

FIG. 13 is a photocopy of an SEM image of a polymeric structures formed on a substrate according to the method described above with respect to "blocking agents". A fluid polymeric precursor of polyurethane was allowed to fill channels formed by indentations in applicator 10 and regions of the surface of Si/$SiO_2$ substrate 18. The polymeric structure was formed by capillary filling of channels defined by indentations in article 10 and the substrate surface. A liquid polyurethane prepolymer was placed adjacent openings of channels and filled the channels via capillary action. The applicator 10 was PDMS, formation of which is referenced above.

Those skilled in the art would readily appreciate that all parameters listed herein are meant to be exemplary and actual parameters will depend upon the specific application for which the methods and apparatus of the present invention are being used. It is, therefore, to be understood that the foregoing embodiments are presented by way of example only and that, within the scope of the appended claims and equivalents thereto, the invention may be practiced otherwise than as specifically described.

What is claimed is:

1. A method comprising:
    providing a substrate including at least one indentation and a region contiguous with the indentation; and
    forming a self-assembled monolayer at the region contiguous with the indentation while leaving the indentation essentially free of the self-assembled monolayer.

2. A method as in claim 1, the forming step involving applying a self-assembled monolayer-forming species to the region contiguous with the indentation.

3. A method as in claim 2, the applying step involving contacting the region contiguous with the indentation with an applicator carrying a self-assembled monolayer-forming species.

4. A method as in claim 3, comprising contacting the region contiguous with the indentation with a flat surface of an applicator carrying a self-assembled monolayer-forming species.

5. A method as in claim 1, wherein the substrate includes a first side and a second side and the indentation is a pathway connecting the first side to the second side.

6. A method as in claim 5, wherein the substrate is essentially flat having first and second opposing sides, and a plurality of hose passing from the first side to the second side, the method involving forming a self-assembled monolayer on at least one of the first and second sides.

7. A method as in claim 1, further comprising exposing the substrate to chemical vapor deposition conditions.

8. A method as in claim 7, comprising allowing a material to be deposited via chemical vapor deposition at the at least one indentation and removing the self-assembled monolayer thereby exposing the region contiguous with the indentation remaining free of the material.

9. A method as in claim 1, further comprising exposing the substrate to a fluid precursor of a material to be deposited at the surface.

10. A method as in claim 9, comprising allowing material to be deposited from the fluid precursor at the at least one indentation and removing the self-assembled monolayer from the region contiguous with the indentation thereby exposing the region contiguous with the indentation remaining free of the material.

11. A method as in claim 7, comprising depositing a metal via chemical vapor deposition at the region contiguous with the indentation.

12. A method as in claim 11, wherein the metal is copper.

13. A method as in claim 9, wherein the fluid precursor is a sol-gel precursor of a metal oxide including a metal or metals selected from the group consisting of Bi, Zr, Sr, Sc, Ta, Li, Nb, Pb, Ti, Ba, and combinations thereof.

14. A method as in claim 1, wherein the substrate has a surface selected from the group consisting of $LaAlO_3$, $SrTiO_3$, MgO, Si, $SiO_2$, Pt/Si, $Al_2O_3$, glass, Al/Si, Ti, N, ITO, Al, Pt, sapphire, and combinations thereof.

15. A method comprising:
    providing an applicator having a CVD blocking agent;
    contacting the applicator with at least one portion of a surface of an article;
    transferring the CVD blocking agent to the at least one portion of a surface of an article from the applicator; and
    exposing the surface to chemical vapor deposition conditions.

16. A method as in claim 15, wherein the blocking agent is a self-assembled monolayer.

17. A method as in claim 16, involving allowing material to be deposited via chemical vapor deposition on a second portion of the surface contiguous with the first portion and removing the self-assembled monolayer thereby creating a pattern on the surface including material deposited on the second portion and the surface at the first portion remaining free of material.

18. A method as in claim 17, wherein the material is selected from the group consisting of copper, platinum, and palladium.

19. A method as in claim 15, wherein the surface is a surface selected from the group consisting of $LaAlO_3$, $SrTiO_3$, MgO, Si, $SiO_2$, Pt/Si, $Al_2O_3$, glass, Al/Si, Ti, N, ITO, Al, Pt, sapphire, and combinations thereof.

20. A method as in claim 15, wherein the surface is nonplanar.

21. A method as in claim 20, wherein the applying step comprises contacting the surface with an applicator having a contoured surface including a plurality of protrusions and indentations such that the protrusions contact a plurality of portions of the surface and apply thereto a self-assembled monolayer, leaving contiguous, second portions of the surface free of the self-assembled monolayer.

22. A method as in claim 20, wherein the applying step involves applying a self-assembled monolayer to a plurality of first portions of the surface and allowing second, contiguous portions to remain free of the self-assembled monolayer, at least one of the second portions including a lateral dimension of less than about 5 $\mu$m.

23. A method as in claim 15, involving applying to the at least one first portion of the surface a self-assembled monolayer from an applicator having a conformable surface by contacting the at least one portion with the conformable surface of the applicator thereby transferring to the at least one first portion a self-assembled monolayer.

24. A method comprising:
    providing a surface;
    positioning a self assembled monolayer blocking agent on a first portion of the surface leaving a second portion free of the blocking agent;
    applying a sol-gel precursor of a material to be deposited at the surface to the blocking agent and the second portion of the surface; and
    removing the blocking agent from the first portion of the surface thereby removing the sol gel precursor from the first portion of the surface, while allowing the sol gel precursor to remain at the second portion.

25. A method as in claim 24, wherein the surface is a surface selected from the group consisting of $LaAlO_3$, $SrTiO_3$, MgO, Si, $SiO_2$, Pt/Si, $Al_2O_3$, glass, Al/Si, Ti, N, ITO, Al, Pt, sapphire, and combinations thereof.

26. A method as in claim 24, involving applying to the first portion of the surface a self-assembled monolayer from an applicator.

27. A method as in claim 26, wherein the applying step comprises contacting the surface with an applicator having a contoured surface including a plurality of protrusions and indentations such that the protrusions contact a plurality of portions of the surface and apply thereto a self-assembled monolayer, leaving contiguous, second portions of the surface free of the self-assembled monolayer.

28. A method as in claim 27, wherein the applying step involves applying a self-assembled monolayer to a plurality of first portions of the surface and allowing second, contiguous portions to remain free of the self-assembled monolayer, at least one of the second portions including a lateral dimension of less than about 5 $\mu$m.

29. A method as in claim 24, involving applying to the first portion of the surface a self-assembled monolayer from an applicator having a conformable surface by contacting the at least one portion with the conformable surface of the applicator thereby transferring to the at least one first portion a self-assembled monolayer.

30. A method as in claim 24, wherein the sol-gel precursor is a precursor of a metal oxide including a metal or metals selected from the group consisting of Bi, Zr, Sr, Sc, Ta, Li, Nb, Pb, Ti, Ba, and combinations thereof.

31. A method as in claim 24, wherein the sol-gel precursor is a precursor of lead zirconium titanate, barium strontium titanate, lead scandium tantalate, lithium niobate, lead lanthanum titanate, lead zirconium titanate, barium strontium titanate, barium titanate, tantalum oxide, or a combination of any of the above.

32. A method comprising:

depositing, via CVD or sol-gel processing, a material proximate first and second portions of a substrate surface wherein the first portion comprises a self assembled monolayer; and removing the material from the first portion while allowing the material to remain at the second portion.

* * * * *

UNITED STATES PATENT AND TRADEMARK OFFICE
CERTIFICATE OF CORRECTION

PATENT NO. : 6,518,168 B1 Page 1 of 1
DATED : February 11, 2003
INVENTOR(S) : Paul G. Clem et al.

It is certified that error appears in the above-identified patent and that said Letters Patent is hereby corrected as shown below:

Column 1,
Line 19, just before the BACKGROUND OF THE INVENTION, please insert -- This invention was made with government support under National Science Foundation Grant CHE9300995, National Science Foundation Grant DMR9400396 and Department of Energy contract DE-FG02-91ER454439. The government has certain rights in this invention. --

Column 23,
Line 3, please add -- formed into the substrate -- after the word "indentation".

Signed and Sealed this

Fourteenth Day of October, 2003

JAMES E. ROGAN
*Director of the United States Patent and Trademark Office*